(12) United States Patent
Kuwajima

(10) Patent No.: US 8,029,701 B2
(45) Date of Patent: *Oct. 4, 2011

(54) MIXED CONDUCTIVE POWDER AND USE THEREOF

(75) Inventor: Hideji Kuwajima, Hitachinaka (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/872,838

(22) Filed: Aug. 31, 2010

(65) Prior Publication Data

US 2010/0323198 A1 Dec. 23, 2010

Related U.S. Application Data

(63) Continuation of application No. 10/570,319, filed as application No. PCT/JP2004/013826 on Sep. 22, 2004, now Pat. No. 7,790,063.

(30) Foreign Application Priority Data

| Sep. 26, 2003 | (JP) | P2003-335181 |
| Sep. 26, 2003 | (JP) | P2003-335211 |
| Mar. 10, 2004 | (JP) | P2004-067152 |

(51) Int. Cl.
*H01B 1/20* (2006.01)
*H01B 1/00* (2006.01)

(52) U.S. Cl. ......... 252/512; 252/514; 252/500

(58) Field of Classification Search ......... 252/512, 252/514, 500
See application file for complete search history.

(56) References Cited

U.S. PATENT DOCUMENTS

| 4,716,081 A | 12/1987 | Ehrreich |
| 5,248,451 A | 9/1993 | Tsunaga et al. |
| 5,372,749 A | 12/1994 | Li et al. |
| 5,779,941 A | 7/1998 | Umeda et al. |
| 5,840,432 A | 11/1998 | Hirai et al. |
| 5,951,918 A | 9/1999 | Kuwajima et al. |
| 6,042,933 A | 3/2000 | Hirai et al. |
| 6,515,237 B2 | 2/2003 | Kikuchi et al. |
| 7,083,859 B2 | 8/2006 | Kuwajima |
| 7,294,289 B2 | 11/2007 | Kuwajima |
| 7,629,017 B2 | 12/2009 | Kodas et al. |
| 7,718,090 B2 * | 5/2010 | Kuwajima et al. ............ 252/500 |
| 7,790,063 B2 * | 9/2010 | Kuwajima ............ 252/512 |
| 2006/0145125 A1 | 7/2006 | Kuwajima et al. |
| 2007/0164260 A1 | 7/2007 | Kuwajima |

FOREIGN PATENT DOCUMENTS

| JP | 03-167713 | 7/1991 |
| JP | 03-211789 | 9/1991 |
| JP | 06-104152 | 4/1994 |
| JP | 7-14425 | 1/1995 |
| JP | 07-331360 | 12/1995 |
| JP | 09-213739 | 8/1997 |
| JP | 2001-214201 | 8/2001 |
| JP | 2001-297627 | 10/2001 |
| JP | 2002-164632 | 6/2002 |
| JP | 2002-198629 | 7/2002 |
| JP | 2002-260443 | 9/2002 |
| JP | 2003-045228 | 2/2003 |
| JP | 2003-123537 | 4/2003 |
| JP | 2004-047418 | 2/2004 |
| JP | 2004-047421 | 2/2004 |
| JP | 2004-063445 | 2/2004 |
| WO | WO 03/019998 | 3/2003 |
| WO | WO 2004/068506 | 2/2004 |

OTHER PUBLICATIONS

German Official Action dated Sep. 17, 2009, for Application No. P 11 2004 001 768.8-34.
Powder Technology Handbook, edited by The Society of Powder Technology Japan, published by Nikkan Kogyo Shimbun, Ltd. Feb. 28, 1986, first printing and a partial translation.
Machine Translation of JP 2004-063445, Feb. 2004.
Machine Translation of JP 2003-045228, Feb. 2003.
Japanese Official Action dated May 12, 2009, for Application No. 2005-514197.

* cited by examiner

*Primary Examiner* — Douglas McGinty
(74) *Attorney, Agent, or Firm* — Antonelli, Terry, Stout & Kraus, LLP.

(57) ABSTRACT

There are disclosed a highly packed, mixed conductive powder with a relative packing density of at least 68%, a process for producing the same, a conductive paste using the mixed conductive powder and a process for producing the same, as well as a sheet and a sheet with attached film using the mixed conductive powder. This mixed conductive powder comprises substantially monodispersed conductive scale-like particles (A1) and conductive substantially spherical particles (B1). Or, this mixed conductive powder comprises substantially monodispersed, conductive, substantially spherical particles (A2) and conductive substantially spherical particles (B2) with a smaller particle diameter than that of the substantially spherical particles (A2).

15 Claims, 3 Drawing Sheets

MIXED CONDUCTIVE POWDER AND USE THEREOF

This application is a Continuation application of application Ser. No. 10/570,319, filed Dec. 8, 2006, now U.S. Pat. No. 7,790,063, which is a National Stage Application, filed under 35 USC 371, of International (PCT) Application No. PCT/JP2004/013826, filed Sep. 22, 2004. The contents of Ser. No. 10/570,319 are incorporated herein by reference in their entirety.

TECHNICAL FIELD

The present invention relates to a highly packed, mixed conductive powder, a process for producing the same, a conductive paste and a process for producing the same, a sheet and a sheet with attached film, a process for producing the same, and a securing process using a sheet with attached film.

BACKGROUND ART

In the field of electronic materials, the formation of wiring layers (conductive layers), the formation of conductive circuits, and the formation of electrodes and the like are all conducted using conductive pastes that contain conductive powders. Furthermore, conductive pastes are also used as conductive or heat conducting adhesives for bonding electronic components together. A conductive paste is prepared by adding binders, organic resins, and where necessary other additives, to a conductive powder containing silver powder, copper powder, aluminum powder, palladium powder, or powdered alloys thereof, and then mixing to a paste-like consistency.

A conductive paste requires a high level of conductivity, meaning the blend quantity of conductive powder must be high, but the paste should also exhibit a level of flowability and a low viscosity that enable ready production and use of the paste. For example, when a conductive paste is used to fill a through hole to effect an interlayer connection, because a high level of conductivity is required even though the hole is small, as much conductive paste as possible must be packed into the hole to enable the hole to be filled with no voids. However, a problem arises in that if the blend quantity of the conductive powder is increased in order to increase the conductivity, then the viscosity of the conductive paste increases, causing a deterioration in the hole filling characteristics.

The total quantity of binder required in a conductive paste is related to the packing density (the packing ratio) of the blended conductive powder. In other words, in those cases where the packing density of the conductive powder is low (the void ratio is large), first, a large quantity of binder is required to fill the voids between particles within the conductive powder, and then an additional quantity of binder must be added to ensure favorable flowability and a low viscosity. Accordingly, if the packing density of the conductive powder is low, then the powder ends up diluted with a large quantity of binder, meaning the quantity of conductive powder within the conductive paste cannot be increased.

In contrast, in those cases where the packing density of the conductive powder is high (the void ratio is small), the quantity of binder required to fill the voids between particles within the conductive powder is small, meaning a conductive paste with a high conductive powder content and a high level of conductivity can be obtained.

In order to raise the packing density of a powder, theoretically, equally sized spherical particles in which the particle size distribution curve exhibits a single peak should be used, and moreover, a combination of large and small spherical particles should be combined, so that the gaps between the large particles are filled with the small particles (see Powder Technology Handbook, first edition, first printing, February 1986 (pp. 101 to 107), edited by The Society of Powder Technology, Japan, published by Nikkan Kogyo Shimbun, Ltd.).

However, in commercially available conductive powders, the smaller the particle size, the more strongly the particles are aggregated together, and even if large and small particles are combined, the type of packing density thought to be theoretically possible cannot be achieved. For example, the relative packing density for a silver powder with a particle diameter of 5 to 20 μm is around 60% at most, whereas for a silver powder with a particle diameter of approximately 1 μm, the relative packing density is around 50% at most, and even if these powders are simply combined and mixed together, the relative packing density achieved is still no more than approximately 60%.

DISCLOSURE OF INVENTION

Accordingly, the present invention has an object of providing a mixed conductive powder with the type of high packing density that has been conventionally unattainable, a process for producing the same, a conductive paste comprising a plurality of conductive powders at a high packing density and a process for producing the same, a sheet and a sheet with attached film comprising a plurality of conductive powders at a high packing density, a process for producing the same, and a securing process using a sheet with attached film.

According to a first aspect of the present invention, there is provided a mixed conductive powder, comprising substantially monodispersed conductive scale-like particles (A1) and conductive substantially spherical particles (B1), and with a relative packing density of at least 68%.

According to a second aspect of the present invention, there is provided a mixed conductive powder, comprising substantially monodispersed, conductive, substantially spherical particles (A2), and conductive substantially spherical particles (B2) with a smaller particle diameter than that of the substantially spherical particles (A2), and with a relative packing density of at least 68%.

According to a third aspect of the present invention, there is provided a process for producing a mixed conductive powder that includes the following.

Preparing substantially monodispersed conductive particles (A) and aggregated conductive particles (B); and mixing the particles (A) and particles (B) so that the impact of the particles (A) on the particles (B) causes the aggregated particles (B) to disaggregate, allowing the particles (A) and particles (B) to disperse and mix.

According to a fourth aspect of the present invention, there is provided a conductive paste comprising a mixed conductive powder according to the present invention above, and a resin binder.

According to a fifth aspect of the present invention, there is provided a conductive paste comprising a mixed conductive powder obtained using a process for producing a mixed conductive powder according to the present invention above, and a resin binder.

According to a sixth aspect of the present invention, there is provided a conductive paste comprising a mixed conductive powder with a relative packing density of at least 68% and a resin binder, wherein the mixed conductive powder comprises from 60 to 96% by weight of a substantially spherical silver-coated copper powder that has undergone surface smoothing, and from 4 to 40% by weight of silver powder, and the silver-coated copper powder is a substantially spherical, fatty acid-adhered, silver-coated copper powder in which the surface of the copper is partially coated with silver and silver-copper alloy, the total quantity of silver is from 3 to 30% by weight relative to the copper, and a quantity of fatty acid equivalent to 0.02 to 1.0% by weight relative to the silver-coated copper powder is adhered to the surface of the silver-coated copper powder.

According to a seventh aspect of the present invention, there is provided a conductive paste comprising a mixed conductive powder with a relative packing density of at least 68% and a resin binder, wherein the mixed conductive powder comprises from 60 to 96% by weight of a substantially spherical silver-coated copper powder that has undergone surface smoothing, and from 4 to 40% by weight of silver powder, and the silver-coated copper powder is a substantially spherical, fatty acid-adhered, silver-coated copper powder obtained by a process comprising; coating the surface of a substantially spherical copper powder with a quantity of silver equivalent to 3 to 30% by weight relative to the copper powder; adhering a quantity of fatty acid equivalent to 0.02 to 1.0% by weight relative to the obtained silver-coated copper powder to the surface of the silver-coated copper powder; and conducting a smoothing treatment of the silver coating.

According to an eighth aspect of the present invention, there is provided a process for producing a conductive paste comprising a plurality of conductive powders that includes the following.

Preparing a mixed conductive powder in which a plurality of conductive powders are mixed together substantially uniformly; and mixing the mixed conductive powder and a resin binder.

According to a ninth aspect of the present invention, there is provided a sheet comprising a mixed conductive powder with a relative packing density of at least 68% and a resin binder, wherein the blend ratio of the mixed conductive powder is from 85 to 96% by weight.

According to a tenth aspect of the present invention, there is provided a sheet obtained using a conductive paste according to the present invention above.

According to an eleventh aspect of the present invention, there is provided a sheet with attached film, comprising a sheet according to the present invention above, and a releasable film that is laminated to at least one surface of the sheet.

According to a twelfth aspect of the present invention, there is provided a securing process using a sheet with attached films that includes the following.

Stamping out a sheet with attached films according to the present invention above;

removing the film from only one surface of the stamped out sheet with attached films, and bonding the exposed sheet surface to the top of a component; and removing the film from the other surface, and bonding another component to the exposed sheet surface, thereby sandwiching the sheet between the two components.

According to a thirteenth aspect of the present invention, there is provided a process for producing a sheet with attached film that includes the following.

Preparing a mixed conductive powder with a relative packing density of at least 68%;

mixing the mixed conductive powder with a resin binder to prepare a paste that comprises from 85 to 96% by weight of the mixed conductive powder; and applying the paste to a releasable film to form a layer.

According to a fourteenth aspect of the present invention, there is provided a process for producing a sheet with attached film, which includes applying a conductive paste according to the present invention above to a releasable film to form a layer.

BRIEF DESCRIPTION OF THE DRAWINGS

FIG. 3 is a series of cross-sectional views showing a schematic representation of an embodiment of a securing process using a sheet with attached film, wherein FIG. 3(A) to FIG. 3(C) show the various steps.

BEST MODE FOR CARRYING OUT THE INVENTION

Figure 1:
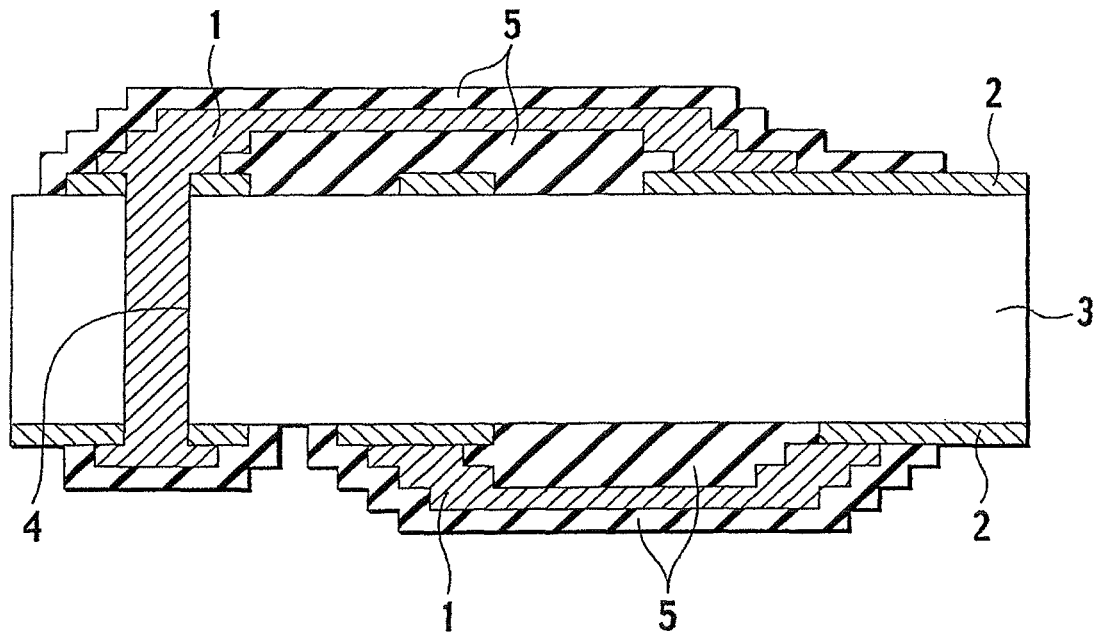
FIG. 1 is a cross-sectional view showing a schematic representation of a through hole and wiring board surfaces connected via a conductive paste.

As follows is a description of preferred embodiments of the present invention.
<Mixed Conductive Powder>

A mixed conductive powder according to the present invention is novel conductive powder that is more highly packed than conventional powders, with a relative packing density of at least 68%. This relative packing density is preferably as high as possible, and consequently includes powders with densities of at least 68% and less than 100%. The relative packing density is preferably at least 70%, and even more preferably 71% or higher. On the other hand, from the viewpoint of ease of production, the relative packing density is preferably no more than 85%, and even more preferably 80% or less. If the relative packing density is less than 68%, then in those cases where the blend ratio of the mixed conductive powder in a conductive paste is increased, the viscosity of the conductive paste increases, causing a deterioration in workability factors such as the filling and application characteristics, whereas in contrast, in those cases where the blend ratio of the mixed conductive powder is small, achieving satisfactory levels of conductivity, heat conductance, and reliability becomes difficult.

The higher the relative packing density of the mixed conductive powder becomes, the more the volume of the resin binder (also referred to as simply the binder) used in forming the paste can be reduced, enabling paste formation to be achieved with a smaller quantity of binder. Furthermore, when mixing the mixed conductive powder with the binder, the viscosity immediately after commencing mixing is still low, meaning uniform mixing can be conducted with ease. For example, if a solvent-free resin binder and a highly packed, mixed conductive powder with a relative packing density of 74% are used, then on paste formation, uniform mixing is possible even if the conductive powder is added to the binder with a blend ratio of 92% by weight. However, if a mixed conductive powder with a relative packing density of 63% is used, and the same blend ratio is added to the binder, then the quantity of binder is inadequate, causing the formation of a dry mixture rather than a paste, and making uniform mixing impossible.

Accordingly, it is only when a highly packed, mixed conductive powder such as that of the present invention is used that a conductive paste with a high blend ratio of conductive powder can be stably and easily produced. Furthermore, by using this conductive paste with a high blend ratio of conductive powder, a sheet with high levels of conductivity and heat conductance can be prepared.

The relative packing density is the value of the packing density divided by the true particle density, expressed as a percentage. In the present invention, the tap density calculated from the volume and mass of a sample following 1,000 tapping repetitions with a stroke of 25 mm using a tap denser is used as the packing density, and the value calculated by dividing this value by the true density or theoretical density of the particles is used as the relative packing density.

A high packing ratio, indicated by a relative packing density of at least 68%, can be achieved by combining substantially monodispersed scale-like particles (A1) and substantially spherical particles (B1). Furthermore, it can also be achieved by combining substantially monodispersed, substantially spherical particles (A2), and substantially spherical particles (B2) with a smaller particle diameter than that of the substantially spherical particles (A2). In the following description, substantially spherical particles are sometimes referred to as simply spherical particles, and of the substantially spherical particles (A2, B2), the particles of large diameter are sometimes referred to as the large particles (A2), and the particles of small diameter as the small particles (B2).

Here, the mixed conductive powder may contain other conductive powders in addition to the scale-like particles (A1) and the spherical particles (B1). For example, the mixed conductive powder may contain spherical particles with an even smaller particle diameter than that of the spherical particles (B1). In a similar manner, the mixed conductive powder may contain other conductive powders in addition to the large particles (A2) and the small particles (B2). For example, the mixed conductive powder may contain spherical particles with an even smaller particle diameter than that of the small particles (B2).

In the present invention, the expression "substantially monodispersed" refers to a state in which the majority of aggregated particles have been disaggregated (and are almost entirely monodispersed), and more specifically, refers to a state in which preferably at least 80%, and even more preferably 90% or greater, of the particles are monodispersed. Even if a portion of the spherical particles (B1) and the small particles (B2) are in aggregate form within the mixed conductive powder, a relative packing density of at least 68% can still be obtained, meaning the spherical particles (B1) and the small particles (B2) need not necessarily be substantially monodispersed.

In the present invention, the expression "substantially spherical particles" refers to particles which can be considered to be of substantially spherical shape, and includes particle clusters and aggregates thereof. The aspect ratio of the particles is preferably at least 1.0 but less than 1.5, even more preferably from 1.0 to 1.3, and most preferably from 1.0 to 1.1.

The aspect ratio is the ratio between the major axis and the minor axis of the particle (major axis/minor axis). In the present invention, the aspect ratio can be calculated from the average particle diameter and the specific surface area. In other words, the particles are assumed to be disc-shaped particles of radius r, thickness t, and density d, and the surface area and weight per particle are calculated. Subsequently, the number of particles per 1 g is calculated, and the specific surface area is the value of the surface area per particle multiplied by the number of particles. Because this specific surface area is represented by a numerical formula that includes t, the value of t can be calculated by making the numerical formula equal to the measured specific surface area. The aspect ratio is calculated from this calculated thickness t and the average particle diameter.

Here, the surface area per particle is represented by $2\pi r^2 + 2\pi rt$, and the weight per particle is represented by $\pi r^2 td$. For example, in the case of scale-like particles of silver with a specific surface area of $2 m^2/g$, an average particle diameter of 6 μm, and a density of 10.5 $g/cm^3$, the thickness t of the particles is calculated as 0.1 μm, and the aspect ratio becomes 60. Furthermore, in the case of scale-like particles of silver with an average particle diameter of 15.8 μm and a specific surface area of 0.09 $m^2/g$, the thickness is calculated as 2.9 μm, and the aspect ratio becomes 5.4.

The average particle diameter of particles can be measured with a laser scattering particle size distribution analyzer. The specific surface area can be measured with a BET specific surface area measurement apparatus.

In those cases where the particles do not exist as a lone powder, but are rather dispersed within a resin, the aspect ratio can be obtained using a method that involves measuring the cross section following resin embedment. In this method, the particles are mixed thoroughly into a low viscosity curable resin, the mixture is left to stand, causing the particles to settle and the resin to cure, the thus obtained cured product is cut in the vertical direction, the shapes of the particles visible at the cut surface are magnified and inspected under a microscope, the major axis/minor axis ratio is determined individually for at least 100 particles, and the average value of these ratios is used as the aspect ratio.

The minor axis mentioned above is determined for a particle visible in the aforementioned cut surface by selecting combinations of two parallel lines that both contact the outside of the particle, with the particle sandwiched therebetween, and of these combinations, the minor axis refers to the distance between the two parallel lines with the narrowest gap therebetween. In contrast, the major axis is determined from two parallel lines that run perpendicularly to the parallel lines used for determining the minor axis, and of the combinations of two parallel lines that contact the outside of the particle, refers to the distance between the two parallel lines with the widest gap therebetween. The rectangle formed by these four lines is of a size that exactly accommodates the particle inside.

The aspect ratio of the aforementioned scale-like particles (A1) is preferably from 1.5 to 10. Provided the aspect ratio falls within this range, the contact between particles is favorable, and a high level of thixotropy is obtained on forming a paste. This aspect ratio is even more preferably from 2 to 8. If the aspect ratio is less than 1.5, then it may become difficult to call the particles scale-like, and in the case of scale-like particles with a large average particle diameter, the orientation diminishes, meaning a paste that includes the particles may suffer reductions in the heat conductance, the conductivity and the opacifying strength within the in-plane direction. In contrast, if the aspect ratio exceeds 10, then the viscosity may increase on paste formation.

From the viewpoints of achieving high-level packing, and favorable viscosity and flowability on paste formation, the average particle diameters of the scale-like particles (A1) and the particles (A2) of larger particle diameter amongst the two types of spherical particles of differing particle diameter (A2, B2) are preferably from 2 to 50 times, even more preferably from 3 to 25 times, even more preferably from 5 to 25 times, and most preferably from 10 to 25 times, the average particle diameters of the substantially spherical particles (B1) and the particles (B2) of smaller particle diameter amongst the two types of spherical particles of differing particle diameter (A2, B2).

Specifically, the average particle diameters of the scale-like particles (A1) and the large particles (A2) are preferably from 3 to 25 μm, with values from 5 to 18 μm being even more desirable.

In the present invention, the average particle diameter of particles refers to the average value of the particle diameter (the primary particle diameter) of each particle deemed to be a particle when viewed in a microscope photograph. In this description, the average particle diameter may also be referred to as the primary particle diameter. This average particle diameter (primary particle diameter) can be measured with a laser scattering particle size distribution analyzer.

In order to ensure favorable particle disaggregation and high-level packing, the average particle diameters of the substantially spherical particles (B1) and the particles (B2) of smaller particle diameter amongst the two types of spherical particles of differing particle diameter (A2, B2) are preferably from 0.3 to 3.0 μm. Provided the average particle diameters of the particles (B1) and the small particles (B2) fall within this range, the contact between particles is favorable, and a high level of thixotropy can be obtained on forming a paste. The average particle diameters of the particles (B1) and the small particles (B2) are even more preferably from 0.5 to 2.5 μm, and most preferably from 0.8 to 2.0 μm.

From the viewpoint of achieving high-level packing, the blend ratio in the mixed conductive powder between the scale-like particles (A1) and the substantially spherical particles (B1), and the blend ratio between the particles (A2) of larger particle diameter and the particles (B2) of smaller particle diameter, reported as volumetric ratios (A1):(B1) or (A2):(B2) respectively, are preferably within a range from 95:5 to 55:45, even more preferably from 85:15 to 55:45, and most preferably from 80:20 to 60:40.

In the present invention, the conductive particles can use either a powder of a single metal such as gold powder, silver powder, copper powder, aluminum powder or palladium powder, or a powder of an alloy of these metals. Of these, the use of silver powder is preferred as it offers very favorable conductivity.

Furthermore, the use of coated metal powders such as copper that has been surface-coated with silver is also desirable, and of such coated powders, the use of copper powder coated with silver is preferred.

For example, in the case where a conductive paste containing silver powder is used to form an electrical circuit or an electrode, if an electric field is applied under an atmosphere of high temperature and high humidity, then electrodeposition of silver known as migration occurs at the electrical circuit or electrode, which can lead to short circuiting between electrodes or between wires. In contrast, if a silver-coated copper powder, and preferably a silver-coated copper powder that has undergone surface smoothing treatment, is used, then migration can be better controlled, and a low-cost conductive paste can be provided instead of using expensive silver powder. In this case, in order to maximize the migration control effect, the surface of the copper powder is preferably only partially coated with silver, leaving some copper exposed, rather than uniformly coating the entire surface. In addition, if copper powder is used as the conductive powder, then the surface is prone to forming an oxide film, whereas by using a copper powder coated with silver, the oxidation of the copper powder surface can be inhibited, meaning a highly reliable conductive paste can be provided.

In addition, a silver-coated copper powder which is partially coated with silver and an alloy of silver and copper is preferably used as the silver-coated copper powder. In such cases, in terms of conductivity and cost, the total quantity of silver (including any silver within silver-copper alloy portions) preferably represents from 3 to 30% by weight, even more preferably from 5 to 22% by weight, and most preferably from 7.5 to 22% by weight, relative to the copper of the core material. Alternatively, when viewed under a microscope, at least 90% but less than 100% of the surface of the copper is preferably coated with silver and silver-copper alloy, with values of at least 95% but less than 100% being even more desirable.

There are no particular restrictions on the method used for coating the surface of the copper powder with silver, and suitable methods include displacement plating, electroplating, and electroless plating. Coating by displacement plating is preferred as it provides excellent adhesive strength between the copper powder and silver, and cheaper running costs.

The surface state of a silver-coated copper powder that has simply undergone silver plating includes large numbers of grain boundaries of the deposited silver, meaning the surface is irregular and not smooth. The existence of these surface irregularities tends to cause an increase in viscosity on paste formation, and moreover, makes the particles prone to aggregation during the plating treatment or the drying step, and as a result, the relative packing density is not high, and is usually less than 60%, and typically less than 55%. Accordingly, if the silver-coated copper powder is disaggregated, and the surface thereof smoothed in a mixer that uses dispersion beads such as zirconia beads, glass beads or alumina beads, then the relative packing density can be increased to 60% to 65%, and using such a powder enables a mixed conductive powder of even higher packing ratio to be obtained, which is desirable.

As a specific example, the silver-coated copper powder can be placed between a ceramic or hard metal roller and the wall surface of a mixing container, and the energy of the repeated collisions of the roller against the wall surface then used to smooth the silver coating layer. If this collision energy is large, then the copper powder of the core material undergoes deformation, and a scale-like silver-coated copper powder (described below) can be obtained.

This smoothing treatment also provides additional benefits. Namely, the smoothing treatment causes a dramatic improvement in the adhesive strength between the silver plating layer and the copper powder of the core material, so that even if dispersion and mixing are conducted using a three roll mill or a stone mill, peeling of the silver plating layer is unlikely. In contrast, in the case of a silver-coated copper powder that has not undergone smoothing treatment, if the treatment time of the dispersion and mixing treatment conducted using a three roll mill or a stone mill is overly long, then the silver plating layer is prone to peeling, and the coloring of the silver-coated copper powder tends to change to a red-brown color.

In addition, as described below, by conducting this smoothing treatment, a portion of the silver undergoes alloying, which causes a dramatic improvement in the migration resistance of the silver-coated copper powder.

By conducting a smoothing treatment of the silver coating, the silver plating layer at the surface is smoothed, and a portion of the layer forms a silver-copper alloy layer at the surface portion of the core copper powder, meaning a portion of the copper is exposed at the surface through the formation of the silver-copper alloy. In other words, the copper present at the surface of the silver-coated copper powder includes both a copper portion of the core material that has not been coated with silver, and a copper portion that has undergone alloying. The coloring of this alloy portion is a metallic color similar to silver, with a slight red-brown tinge, and the exposed copper cannot be detected with the naked eye. However, if the particles are brought into contact with salt water, then the color changes to a green-blue color, confirming that copper is exposed at the surface of the particles.

Methods that rely on impact, such as the smoothing treatment described above, are the preferred method for converting a portion of the silver plating layer to a silver-copper alloy.

If required, a fatty acid may also be either adhered to the surface of the silver-coated copper powder, or used to coat a portion of the surface, so that the powder is used as a fatty acid-adhered, silver-coated copper powder. If the quantity of this fatty acid is too large, then there is a danger that the particles may become prone to aggregation via the fatty acid, and consequently the quantity is preferably within a range from 0.02 to 1.0% by weight, even more preferably from 0.02 to 0.5% by weight, and most preferably from 0.02 to 0.3% by weight, relative to the silver-coated copper powder. The fatty acid is thought to adhere randomly to the surface of the silver-coated copper powder, including the silver portions, silver-copper alloy portions, and uncoated copper portions, providing a further coating on a portion of the surface of the silver-coated copper powder.

Examples of the fatty acid include saturated fatty acids such as stearic acid, lauric acid, capric acid and palmitic acid, or unsaturated fatty acids such as oleic acid, linoleic acid, linolenic acid and sorbic acid.

If a portion of the surface of the silver-coated copper powder is coated with a fatty acid then the following benefits can be obtained. Namely, in those cases where a copper powder is subjected to silver plating, a subsequent drying step must be used to dry the moisture contained within the copper powder, but if this moisture is dried directly, then because water has a large latent heat of vaporization, a great deal of time is required for the drying process, and there is a danger of particles of the conductive powder aggregating. However, if the water is first substituted with a hydrophilic organic solvent such as alcohol or acetone, and this organic solvent is then dried, the drying process is considerably easier, and aggregation between conductive powder particles also diminishes. Accordingly, by dissolving a fatty acid in this organic solvent, and adding the organic solvent to the silver-coated copper powder, so that a quantity of fatty acid that falls within the range described above is adhered uniformly to the surface of the silver-coated copper powder, the drying of the silver-coated copper powder can be simplified, aggregation within the silver-coated copper powder can be readily disaggregated, and a mixed conductive powder with a high packing density can be obtained with no reduction in the adhesive strength. In addition, by adhering a fatty acid to the powder, a mixed conductive powder that is more readily wet with the resin binder can be obtained.

From the description above it is evident that, as the silver-coated copper powder, the use of a fatty acid-adhered, silver-coated copper powder (C1), comprising a silver-coated copper powder that has undergone surface smoothing, and in which the surface of the copper powder is partially coated with silver and a silver-copper alloy, wherein the total quantity of silver is from 3 to 30% by weight relative to the copper, and a quantity of fatty acid equivalent to 0.02 to 1.0% by weight relative to the silver-coated copper powder is adhered to the surface of the powder is the most desirable.

Alternatively, the use of a fatty acid-adhered, silver-coated copper powder (C2) produced using a process that comprises the steps of coating the surface of a copper powder with a quantity of silver equivalent to 3 to 30% by weight relative to the copper powder; adhering a quantity of fatty acid equivalent to 0.02 to 1.0% by weight relative to the obtained silver-coated copper powder to the surface of the silver-coated copper powder; and conducting a smoothing treatment of the silver coating is also preferred. This process need only include each of the above steps, and so the sequence of the steps within the process are not limited to the sequence described above. For example, by adhering the fatty acid to the surface of the silver-coated copper powder and then performing smoothing treatment on the silver, any aggregated particles can be disaggregated, and re-aggregation can be prevented, meaning the smoothing operation can be conducted smoothly.

Fatty acid-adhered, silver-coated copper powders (C1, C2) such as those described above can be used favorably as the aforementioned scale-like particles (A1) or the aforementioned particles (A2) of larger particle diameter. When used as scale-like particles (A1), the particles can be obtained by a process that includes an additional step for converting the silver-coated copper powder to a scale-like form. This scale formation treatment for the silver coating can be conducted, for example, using a mixer such as a ball mill containing dispersion beads such as zirconia beads. This scale formation step is preferably conducted after adhering of the fatty acid, and conducting the treatment at the same time as the silver smoothing treatment reduces the number of steps and is more efficient. The scale formation treatment can, of course, also be conducted as a separate step following the silver smoothing treatment.

When a fatty acid-adhered, silver-coated copper powder (C1, C2) is used as the aforementioned large particles (A2), the powder can be produced using a substantially spherical copper powder as the core material. In such a case, from the viewpoints of handling properties such as the printing, discharge and filling characteristics, as well as cost, the average particle diameter of the substantially spherical fatty acid-adhered, silver-coated copper powder is preferably within a range from 3 to 17 μm, and even more preferably from 5 to 17 μm.

In those cases where a fatty acid-adhered, silver-coated copper powder (C1, C2) is used as either the scale-like particles (A1) or the large particles (A2), from the viewpoints of suppressing increases in viscosity and ensuring favorable flowability, the aforementioned spherical particles (B1) and small particles (B2) are preferably substantially spherical or aggregated silver powders. The average particle diameter of the silver powder of (B1) or (B2) is preferably within a range from $1/50$ to $1/2$ the average particle diameter of the fatty acid-adhered, silver-coated copper powder (C1, C2).

A highly packed, mixed conductive powder according to the present invention can be produced using any appropriate production process. For example, although the powder can be readily produced using the process for producing a mixed conductive powder according to the present invention described below, the present invention is not limited to this process.

In other words, by combining the aforementioned scale-like particles (A1) and spherical particles (B1), or by combining the aforementioned particles (A2) of larger particle diameter and the particles (B2) of smaller particle diameter, a relative packing density of the present invention can be achieved, and suitable mixing conditions (including the type of mixer, the mixing time, the rotational speed, and the size and degree of filling of the mixing container) may be selected in accordance with factors such as the blend ratios of the two components, the ratio between the two average particle diameters, the particle size distribution of each particle component, and the degree and strength of aggregation of the raw material particles.

<Process for Producing Mixed Conductive Powder>

A process for producing a mixed conductive powder according to the present invention comprises the steps of preparing substantially monodispersed conductive particles (A) and aggregated conductive particles (B); and mixing the particles (A) and particles (B) so that the impact of the particles (A) on the particles (B) causes the aggregated particles (B) to disaggregate, allowing the particles (A) and particles (B) to disperse and mix. In the following description, the particles (B) that are aggregated are referred to as the aggregated particles (B).

With commercially available conductive powders, the smaller the particle diameter becomes, the more likely it is that a portion of the particles are aggregated, and small particles with particle diameters from approximately 0.3 to 2 μm are usually particularly strongly aggregated, and conducting dispersion to satisfactorily disaggregate these aggregates requires an enormous effort and is extremely difficult. Normally, dispersion of fine particles is conducted in a mixer, using dispersion beads of zirconia, alumina or glass or the like, with a diameter of approximately 0.5 mm, but if these type of beads are used, then in the case of a soft metal such as silver, rather than the aggregated particles being disaggregated, the collision energy of the beads causes a deformation of the particles into a scale-like form, and there is a danger that adequate disaggregation may not be achieved. In addition, if the particles deform into a scale-like form, there is a danger that the powerful energy of the beads will cause scale-like particles to become integrated into single units, making the disaggregation problem even more difficult. If the disaggregation is inadequate, then a mixed powder with a high packing ratio cannot be obtained.

In those cases where dispersion beads are used, even if small beads with a diameter of less than 0.2 mm are used, the particles may still undergo deformation. In addition, if beads with this type of small diameter are used, then the operation of separating the beads and the particles of the conductive powder becomes very difficult, and even in the sieving operation, the beads and conductive powder particles collide with each other, which can cause particle deformation or crushing.

In contrast, according to the aforementioned process for producing a mixed conductive powder according to the present invention, rather than using conventional beads to impart impact, the aggregated particles (B) are disaggregated by causing the substantially monodispersed particles (A) to collide with the aggregated particles (B), thereby imparting impact, while the particles (A) and the aggregated particles (B) are mixed together, and consequently even if the aggregated particles (B) are of a soft material, deformation is suppressed, and satisfactory disaggregation can be achieved with ease. In this case, the aggregated particles (B) are also exposed to additional impacts other than the impact of the particles (A), such as the impacts between aggregated particles (B), and impacts with the wall surfaces, and in a similar manner, the particles (A) are also exposed to a variety of interparticle impacts and wall surface impacts.

The particles (A) are preferably larger particles, and the particles (B) are preferably smaller particles, and by disaggregating aggregates of the small particles with larger particles, the type of favorable dispersion that has been conventionally unattainable can be produced with ease.

A comparison of the collision energies for a case in which dispersion beads are used for disaggregating the particles (B), and a case in which scale-like particles (A1) are used as the particles (A) reveals the following. The collision energy is proportional to the mass of the colliding particle. For example, if the diameter of the dispersion beads is 0.2 mm, and the average particle diameter of the scale-like particles is 0.02 mm with an aspect ratio of 5, then the volumetric ratio between a dispersion bead and a scale-like particle is approximately 3000. Accordingly, even allowing for a difference in specific gravity, the collision energy received by a particle (B) in the case of a collision with a dispersion bead is at least 1000 times larger than that for a collision with a scale-like particle.

Conventional devices such as ball mills, rocking mills, V-blenders and vibration mills can be used as the mixer used in the mixing process, and the aforementioned particles (A) and aggregated particles (B) that function as the raw materials are placed in the mixer and mixed in their raw material powder form. This allows aggregates of the particles (B) to be disaggregated while deformation of both types of particles is suppressed.

The average particle diameter of the particles (A) is preferably from 2 to 50 times, even more preferably from 3 to 25 times, and most preferably from 5 to 25 times, the average particle diameter of the particles (B). In consideration of the energy that must be applied to effect disaggregation, this value is preferably at least two fold, whereas consideration of the viscosity and flowability that arise when the generated mixed conductive powder is used to form a paste means the value is preferably less than 50 fold.

The particles (A) are preferably either the scale-like particles (A1), or the particles (A2) of larger particle diameter, used in the aforementioned mixed conductive powders according to the present invention.

The particles (B) are preferably substantially spherical particles, with an average particle diameter of 0.3 to 3.0 μm. In addition, the particles (B) are preferably either the substantially spherical particles (B1), or the particles (B2) of smaller particle diameter, used in the aforementioned mixed conductive powders according to the present invention.

The relative packing density of a mixed conductive powder obtained using this production process is preferably at least 68%. In other words, by using this process, a high packing ratio mixed conductive powder with a relative packing density of at least 68% can be produced with ease.

<Conductive Paste>

A conductive paste according to the present invention comprises an aforementioned mixed conductive powder according to the present invention, or a mixed conductive powder obtained using an aforementioned process for producing a mixed conductive powder according to the present invention, and a resin binder, and is a paste that exhibits a high level of conductivity and good flowability.

In addition, a mixed conductive powder with a relative packing density of at least 68%, and comprising from 60 to 96% by weight of a substantially spherical silver-coated copper powder that has undergone surface smoothing, and from 4 to 40% by weight of silver powder can be used as the mixed conductive powder. The blend ratios of the two components are preferably selected within these ranges from the viewpoints of the resulting migration resistance and the packing density, and ranges from 60 to 85% by weight for the silver-coated copper powder and from 15 to 40% by weight for the silver powder are even more preferred, with ranges from 65 to 80% by weight for the silver-coated copper powder and from 35 to 20% by weight for the silver powder being the most desirable.

Here, the substantially spherical silver-coated copper powder that has undergone surface smoothing is preferably a substantially spherical, aforementioned fatty acid-adhered, silver-coated copper powder (C1), wherein a quantity of fatty acid equivalent to 0.02 to 1.0% by weight relative to the silver-coated copper powder is adhered to the surface of a silver-coated copper powder, in which the surface of the copper powder is partially coated with silver and a silver-copper alloy, and the total quantity of silver is from 3 to 30% by weight relative to the copper.

Alternatively, the substantially spherical silver-coated copper powder that has undergone surface smoothing is preferably a substantially spherical, aforementioned fatty acid-adhered, silver-coated copper powder (C2) obtained by a process comprising the steps of coating the surface of a substantially spherical copper powder with a quantity of silver equivalent to 3 to 30% by weight relative to the copper powder; adhering a quantity of fatty acid equivalent to 0.02 to 1.0% by weight relative to the obtained silver-coated copper powder to the surface of the silver-coated copper powder; and conducting a smoothing treatment of the silver coating (although there are no particular restrictions on the sequence in which these steps are conducted).

By using a fatty acid-adhered, silver-coated copper powder (C1, C2), a conductive paste can be provided that is cheaper and exhibits better migration resistance than silver paste, and exhibits superior conductivity and reliability to copper paste. The average particle diameter of this fatty acid-adhered, silver-coated copper powder is preferably from 3 to 17 µm.

The shape of the silver powder within the mixed conductive powder is preferably either substantially spherical, or of aggregate form, and the average particle diameter is preferably from 1/50 to 1/2 the average particle diameter of the aforementioned fatty acid-adhered, silver-coated copper powder. Here, a silver powder aggregate refers to the crude form produced when silver particles are simply deposited by reduction.

Additional details relating to the fatty acid-adhered, silver-coated copper powders (C1, C2) are as described above.

The method of dispersing and mixing the silver-coated copper powder and the silver powder can use a method that uses either the rotational or vibration energy of a device such as a ball mill, rocking mill, V-blender or vibration mill, in a similar manner to that described above for the production of the mixed conductive powder. The silver-coated copper powder is preferably used as the dispersion medium, so that the aggregated fine particles of silver powder undergo disaggregation and dispersion at the same time, but there are no particular restrictions on the apparatus or method used.

A resin binder (binder) is a binder that comprises a resin. If necessary, the binder may be a resin composition containing added additives or solvents, and there are no particular restrictions on the composition of the binder. In the case of a composition, the blended components are preferably in a uniformly mixed state. The resin itself may also be referred to as a binder.

Any of the various thermosetting resins and thermoplastic resins and the like may be used as the resin, and if necessary, these resins are used in combination with additives such as curing agents, coupling agents and antifoaming agents, or solvents. In those cases where a thermosetting resin such as an epoxy resin, phenol resin, polyamide resin, or polyamide-imide resin is used, a flexibility imparting agent such as a monoepoxide or polyethylene glycol is also used in order to lower the viscosity.

The phenol resin can use conventional resins such as novolac and resol resins. In the case of resol-type phenol resins, using a resin in which the methylol groups have been etherified with an alcohol to form alkoxy groups provides a more stable viscosity in those cases where the mixed conductive powder includes coated copper powder in which the active copper surface is exposed, and is consequently one of the preferred binders.

The epoxy resin preferably uses a resin that is liquid at room temperature. Epoxy resins that crystallize at room temperature can be prevented from crystallizing by mixing with a liquid epoxy resin. Epoxy resins that are liquid at room temperature include resins that are solid at room temperature, but which by mixing with an epoxy resin that is liquid at room temperature, are converted to a liquid form that is stable at room temperature. Here, room temperature means a temperature of approximately 25° C.

The epoxy resin can use conventional materials, and any compound that contains at least 2 epoxy groups within the molecule, and is capable of forming a three dimensional structure is suitable. Specific examples include aliphatic epoxy resins such as bisphenol A, bisphenol AD, bisphenol F, novolacs, polyglycidyl ethers obtained by reaction between cresol novolacs and epichlorohydrin, dihydroxynaphthalene diglycidyl ether, butanediol diglycidyl ether and neopentyl glycol diglycidyl ether, heterocyclic epoxy resins such as diglycidyl hydantoin, and alicyclic epoxy resins such as vinylcyclohexene dioxide, dicylopentadiene dioxide, and alicyclic diepoxy adipate. These epoxy resins can be used either alone, or in mixtures of two or more different resins.

Examples of curing agents for epoxy resins include amines such as menthanediamine, isophoronediamine, metaphenylenediamine, diaminodiphenylmethane, diaminodiphenylsulfone, and methylenedianiline; acid anhydrides such as phthalic anhydride, trimellitic anhydride, pyromellitic anhydride, succinic anhydride, and tetrahydrophthalic anhydride; compound-based curing agents such as imidazole and dicyandiamide; and resin-based curing agents such as polyamide resins and urea resins. If required, these curing agents may be used in combination with a curing agent such as a latent amine curing agent, and other compounds such as tertiary amines, imidazoles, triphenylphosphine, and tetraphenylphosphenyl borate, which are well known as curing accelerators for epoxy resins and phenol resins, may also be added.

In terms of the glass transition point (Tg) of the cured product of the conductive paste, the quantity of these curing agents is preferably within a range from 0.1 to 30 parts by weight, and even more preferably from 1 to 10 parts by weight, per 100 parts by weight of the epoxy resin.

If required, the resin binder may also contain a flexibility imparting agent. The flexibility imparting agent can use a conventional material, and suitable examples include monoepoxides that contain only a single epoxy group within each molecule, including typical monoepoxides such as n-butyl glycidyl ether, versatic glycidyl ether, styrene oxide, ethylhexyl glycidyl ether, phenyl glycidyl ether, cresyl glycidyl ether, and butylphenyl glycidyl ether. These flexibility imparting agents can be used either alone, or in mixtures of two or more different compounds.

In addition to the materials described above, other materials such as thixotropic agents, coupling agents, antifoaming agents, powder surface treatment agents, and sedimentation prevention agents can also be blended with the resin binder if required. The quantity of these additives, which are added as required, is preferably within a range from 0.01 to 1% by weight, and even more preferably from 0.03 to 0.5% by weight, relative to the conductive paste.

In the case of a typical conductive paste used for filling holes, because the generation of voids within the through holes is undesirable, either a solvent-free resin, or a low-solvent resin in which the quantity of solvent within the paste has been reduced to no more than 2% by weight, is preferably used for this type of application. In other words, the solvent content within the conductive paste is preferably no more than 2% by weight. Specifically, an epoxy resin is preferably used as the solvent-free resin.

Conductive pastes that contain a solvent, exhibit a larger decrease in volume than conductive pastes that contain no solvent, equivalent to the solvent content, when the paste is applied by printing and cured by heat treatment. Furthermore, in the heat treatment process, conductive pastes that contain a solvent display a large, temporary fall in the viscosity of the conductive paste, causing the conductive powder contained within the conductive paste to become very compact within the conductive layer.

For these reasons, in the case of a paste used for forming, on the surface of a substrate, a sheet-like or linear circuit that is parallel to the surface of a substrate, a conductive paste containing a solvent may enable better conductivity to be achieved, with a smaller variation in the conductivity, than a paste that contains no solvent, provided the solvent drying is conducted gradually. In other words, in some cases, a conductive paste for forming a circuit preferably contains a solvent, as including the solvent may improve the conductivity and reduce variation in the conductivity.

The solvent used in the preparation of the conductive paste is preferably a solvent that generates a large temporary reduction in the viscosity of the conductive paste during heat treatment, and if the evaporation rate of butyl acetate is deemed to be 100, then solvents for which the evaporation rate is greater than zero but no more than 28 are preferred, and solvents with a boiling point that falls within a range from 150 to 260° C. are preferred. Specific examples include dipropylene glycol methyl ether, dipropylene glycol ethyl ether, dipropylene glycol butyl ether, dipropylene glycol isopropylmethyl ether, dipropylene glycol isopropylethyl ether, tripropylene glycol methyl ether, propylene glycol tertiary butyl ether, propylene glycol ethyl ether acetate, ethylene glycol ethyl ether acetate, ethylene glycol butyl ether, diethylene glycol methyl ether, triethylene glycol methyl ether, diethylene glycol ethyl ether, ethylene glycol butyl ether, diethylene glycol butyl ether, 3-methyl-3-methoxybutanol, 3-methyl-3-methoxybutyl ether, ethyl lactate, and butyl lactate.

From the viewpoint of conductivity, the blend ratio of the mixed conductive powder, relative to the solid fraction of a conductive paste that contains the types of components described above, is preferably at least 85% by weight, and taking into consideration the viscosity of the paste produced, is preferably no more than 96% by weight. Accordingly, the blend ratio of the resin binder is preferably from 4 to 15% by weight. Pastes in which the mixed conductive powder accounts for 90 to 96% by weight and the resin binder accounts for 4 to 10% by weight are more preferred, and pastes in which the mixed conductive powder accounts for 92 to 96% by weight and the resin binder accounts for 4 to 8% by weight are even more desirable. If the viscosity of the paste becomes overly high, then the adhesive strength and the strength of the conductive paste may decrease, which can cause a deterioration in reliability.

If the packing density of the conductive powder is low, then even if an attempt is made to produce a paste containing a high conductive powder content, a dry mixture with an extremely high viscosity results, making formation of a paste impossible, whereas in the present invention, because a mixed conductive powder with a high packing ratio is used, a paste containing a high proportion of conductive powder of at least 85% by weight, and even 90% by weight or higher, can be produced.

There are no particular restrictions on the method used for forming a paste using the mixed conductive powder and the resin binder, and either an agitation mixer such as an automatic mortar, stone mill or planetary mixer, or a three roll mill, or a mixer in which a container is revolved while rotating about its axis, thereby mixing and defoaming the materials inside the container, can be used, and a suitable combination of these devices can also be used to disperse and mix the components. One example is a method in which an agitation mixer is used to substantially mix the components, and dispersion is then completed using a three roll mill. However, if a high packing ratio paste containing at least 92% by weight of a mixed conductive powder is processed using a three roll mill, then even if the three roll mill gap is between several dozen and a hundred μm, the highly packed particles are compressed by the three roll mill, causing particle deformation and integration of large and small particles, thereby raising the danger of an increase in the viscosity of the paste, and consequently when a paste with a high packing ratio is prepared, a stone mill is preferably used instead of a three roll mill.

There are no restrictions on the applications for the conductive paste, but being a paste containing a conductive powder with a high packing density, it can be used particularly favorably in the electronic materials field, in those situations that require good conductivity and heat conductance. Specifically, the conductive paste can be favorably used for the formation of wiring layers (conductive layers), electrical (conductive) circuits or electrodes in printed wiring boards or electronic componentry, or as a conductive adhesive, a heat conducting adhesive, a conductive sheet material, or a heat conducting sheet material.

One example of a method of forming a conductive circuit using a conductive paste is presented below. As shown in FIG. 1, a conductive layer 1 can be formed by applying the conductive paste to the surface of a base material (substrate) 3, and using the paste to fill a through hole 4. In FIG. 1, numeral 2 is a copper foil, and numeral 5 is an insulating layer.

When this type of hole-filling conductive paste is used to fill a through hole, thereby achieving an interlayer connection, because a high level of conductivity is required even though the hole is small, the high conductivity paste must be packed into the hole with no voids. Because a conductive paste of the present invention contains a conductive powder at a high packing density, and yet still exhibits suitable levels of viscosity and flowability, the dual requirements of favorable packing characteristics within the hole and good conductivity can both be satisfied.

In those cases where a conductive paste is used as a conductive adhesive, an automated device is used to push an injection cylinder, thereby supplying a desired quantity of the conductive adhesive to a desired location, and subsequently supplying the adhesive to a different location, but in such cases, unless the thixotropic characteristics of the conductive adhesive are good, the paste develops trailing threads, which can give rise to trouble as a result of the conductive adhesive making contact in unneeded locations. Because a conductive paste of the present invention comprises a highly packed, mixed conductive powder that also incorporates a fine powder (small particles), the thixotropic characteristics are high, meaning supply of the paste can be conducted in a favorable manner.

In those cases where a conductive paste is used as a heat conducting adhesive for bonding together components for which heat radiation is required, conventionally, because the packing density of conductive powders has been low, a drawback has arisen in that although heat conductance in a penetration direction through the layer is high, the heat conductance within the in-plane direction may be either high or low, and tends to be variable. In contrast, because a conductive paste of the present invention contains a conductive powder at a high packing ratio, isotropy can be achieved, meaning this type of variability can be prevented.

<Process for Producing Conductive Paste>

A process for producing a conductive paste according to the present invention is a process for producing a conductive paste comprising a plurality of conductive powders, and comprises the steps of preparing a mixed conductive powder in which a plurality of conductive powders are mixed together substantially uniformly; and mixing the mixed conductive powder and a resin binder. With this process, the time required for mixing is short, and a plurality of conductive powders can be converted to paste form simply and conveniently.

In other words, in the production of a conductive paste comprising a plurality of conductive powders, rather than mixing each of the conductive powders X and Y sequentially into the resin binder, as in conventional processes, a characteristic feature of this process is that a dry blend of the conductive powders X and Y is first prepared, and this blend is then mixed with the resin binder. The inventor of the present invention ascertained that by first mixing the desired particles substantially uniformly, and then mixing the resulting mixture with the resin binder, the damage inflicted on the particles by external forces from the mixer during the mixing process with the resin binder could be restricted to a minimum, meaning a paste could be produced with good reproducibility, in a short period of time, and with ease.

The mixed conductive powder used preferably has a relative packing density of at least 68%, and is preferably either an aforementioned mixed conductive powder of the present invention, or a mixed conductive powder obtained using the aforementioned process for producing a mixed conductive powder according to the present invention.

The mixed conductive powder content within the produced conductive paste is preferably from 85 to 96% by weight.

In consideration of the workability of the drying and curing operations, the solvent content within the produced conductive paste is preferably no more than 2% by weight. A conductive paste with such a low solvent content is unlikely to suffer constraints in the drying step, and is consequently particularly ideal for filling locations such as via holes.

For the dispersion and mixing, the type of aforementioned conventional mixer used in the formation of a paste of a mixed conductive powder and a resin binder can be used. In the same manner as described above, a combination of a plurality of devices may also be used to achieve the dispersion and mixing. However, even in these cases, by using a mixed conductive powder in which the conductive powders have been dispersed uniformly, the treatment time can be significantly reduced in comparison with the case where a plurality of different conductive powders are added to the binder and then dispersed sequentially.

<Sheet>

A sheet according to the present invention is one comprising a mixed conductive powder with a relative packing density of at least 68% and a resin binder, wherein the blend ratio of the mixed conductive powder is from 85 to 96% by weight. Because this sheet comprises a high blend ratio of a highly packed, mixed conductive powder, it exhibits excellent levels of conductivity and heat conductance, and because the contact between particles within the in-plane direction is also good, the conductivity and heat conductance are also excellent in the in-plane direction. Accordingly, a sheet according to the present invention can be favorably used as a conductive sheet or a heat conducting sheet or the like.

The mixed conductive powder within the sheet is preferably either an aforementioned mixed conductive powder according to the present invention, or a mixed conductive powder obtained using the aforementioned process for producing a mixed conductive powder according to the present invention.

A sheet according to the present invention is also preferably a sheet produced using an aforementioned conductive paste according to the present invention.

In terms of ease of handling, and considering that thinner films offer superior heat conductance, the thickness of the sheet is preferably from 15 to 100 μm, and even more preferably from 15 to 50 μm.

The resin used for the resin binder is preferably selected in accordance with the intended application for the sheet. For example, in the case in which following uniform mixing with the mixed conductive powder, the resin is semi-cured, subsequently used to bond together two components, and then heated to complete the resin curing process, a thermosetting resin such as an epoxy resin is preferably used in combination with a curing agent. Furthermore, if a resin that can be cured to a rubber-like state is used, then in those cases where the contact surfaces of the components to be bonded together are not flat, a sheet can be placed on the contact surfaces of the components, and the two components then pressed firmly together, thereby improving the contact efficiency at both surfaces. Furthermore, if a silicone rubber is used as the binder, then because the rubber exhibits adherence to flat surfaces, the sheet can be removed more easily than if a thermosetting resin is used as the binder, which simplifies operations in the case of component replacement. The resin binder is preferably solvent-free, although a resin binder of reduced viscosity that contains a solvent may also be used, and the solvent then dried and removed following application.

Examples of the resin include thermosetting resins such as epoxy resins and polyester resins, as well as solvent-free silicone resins, solvent-based nitrile rubbers, and acrylonitrile rubbers. If necessary, the resin binder may also contain additives such as defoaming agents and coupling agents. Other details relating to the resin binder are as described above.

Of these, using a solvent-free or substantially solvent-free silicone resin is preferred, as it enables a sheet that is pliable and exhibits good adhesion to flat surfaces to be obtained, meaning the sheet offers good workability. In addition, by using a silicone resin, temporary bonding of components can be achieved using the sheet, meaning if a bonded component requires exchanging, the repair operation can be conducted with ease.

Here, referring to a resin as substantially solvent-free means the resin contains a small enough quantity of solvent that following application of the paste to a film, a step for removing the solvent is not required.

This sheet can be produced easily by, for example, applying a paste comprising a mixed conductive powder and a resin binder to an arbitrary substrate that exhibits favorable releasability, drying the paste, if required, to remove any solvent contained within the paste, and then semi-curing or curing the resin, if required. Specifically, a sheet can be favorably produced using the process for producing a sheet with attached film described below.

<Sheet with Attached Film>

A sheet with attached film according to the present invention comprises an aforementioned sheet according to the present invention, and a releasable film that is laminated to at least one surface of the sheet, and can be favorably used as a film-backed heat conducting sheet or the like.

Figure 2:
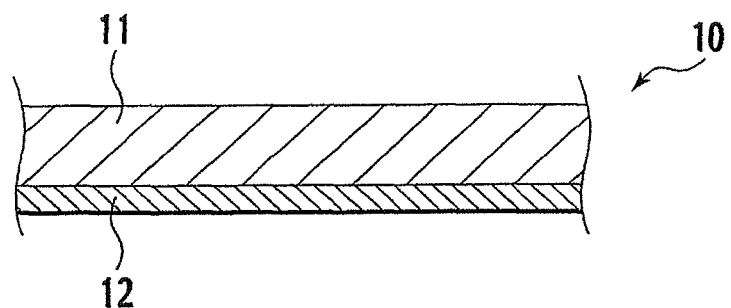
FIG. 2 is a cross-sectional view showing a schematic representation of an embodiment of a sheet with attached film.

Specifically, as shown schematically in the cross-sectional view of FIG. 2, a sheet with attached film 10 comprises a sheet 11, and a releasable film 12 that is laminated to the surface of the sheet.

Although not shown in the figure, this sheet with attached film may also be a multilayered structure of 3 or more layers that contains other laminated layers. For example, releasable films (release films) 12 may be laminated to both surfaces of the sheet 11, forming a 3-layered structure. Layers other than release films may also be used, and for example, an adhesive layer containing a thermosetting epoxy resin as a binder may be laminated to a sheet that contains a silicone rubber as a binder in order to improve the adhesive strength.

The releasable film 12 is a film that can be used as the base material when handling a very thin sheet, and there are no particular restrictions on the material of the film, provided it is able to support a sheet formed from a paste comprising a mixed conductive powder and a resin binder, such as a sheet formed by curing the paste to a rubber-like consistency, and is also able to be removed from the sheet once the sheet has been stuck to the target object.

The thickness of the releasable film 12 need only be thin, and considering factors such as removal workability, is preferably from 15 to 30 μm. The smoothness of the release film should be sufficient enough that the surface of the sheet following removal of the release film from the prepared sheet with attached film can be bonded satisfactorily to the component that requires heat radiation or the like.

<Process for Producing Sheet with Attached Film>

A process for producing a sheet with attached film according to the present invention comprises the steps of preparing a mixed conductive powder with a relative packing density of at least 68%; mixing the mixed conductive powder with a resin binder to prepare a paste that comprises from 85 to 96% by weight of the mixed conductive powder; and applying the paste to a releasable film to form a layer.

If required, the process may also include either one, or both, of the following steps: namely, a step for removing the solvent contained within the paste following application of the paste and formation of a green sheet, and a step for curing or semi-curing the resin within the paste. If necessary, following formation of the green sheet, another release film may be laminated to the sheet to form a 3-layered structure.

Either an aforementioned mixed conductive powder according to the present invention, or a mixed conductive powder obtained using the aforementioned process for producing a mixed conductive powder according to the present invention can be favorably used as the mixed conductive powder.

Alternatively, a process in which an aforementioned conductive paste according to the present invention is applied to a releasable film to form a sheet with attached film is also a preferred process.

As described above in relation to the sheet, the resin binder is preferably a substantially solvent-free silicone resin.

Specifically, the paste applied to the surface of the releasable film can be prepared, for example, by mixing uniformly together predetermined quantities of a silicone resin, a curing agent, and a mixed conductive powder with a relative packing density of at least 68%. The mixing method can use any method capable of mixing the blended components uniformly. Typically, a stirrer, stone mill, or mortar or the like can be used. This also applies to those cases where a solvent-based rubber is used as the resin binder.

The method of applying the paste may be any method capable of achieving a uniform coating, and typically, blade coating or bar coating are used. There are no particular restrictions on the heating method used for drying and removing the solvent, or curing or semi-curing the resin, and suitable methods include not only hot air heating, but in those cases where a solvent-free binder is used, also include methods in which following winding into a roll, the roll is placed in a heated oven. In those cases where curing is required for a solvent-free silicone resin, a heating temperature of 80 to 120° C. is preferred.

<Securing Process Using Sheet with Attached Film>

A securing process using a sheet with attached film according to the present invention uses an aforementioned sheet with attached films, in which release films are laminated to both surfaces of the sheet, and comprises the steps of stamping out a sheet with attached films; removing the film from only one surface of the stamped out sheet with attached films, and bonding the exposed sheet surface to the top of a component; and removing the film from the other surface, and bonding another component to the exposed sheet surface, thereby sandwiching the sheet between the two components.

Figure 3:
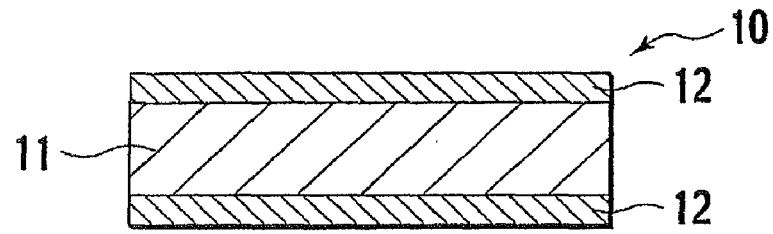
Figure 3:
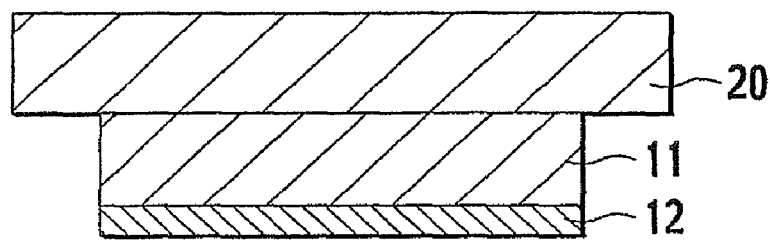
Figure 3:
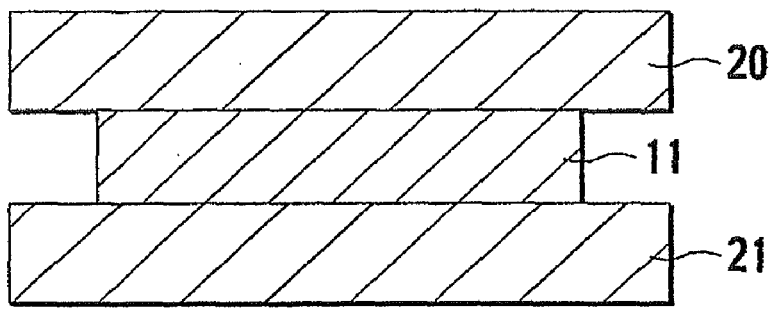

An embodiment of this securing process is described below with reference to FIG. 3. First, a sheet with attached films 10 comprising release films 12, 12 laminated to both surfaces is prepared, and a die or the like is then used to stamp out the sheet into the desired shape. FIG. 3(A) shows a cross-sectional view of the stamped out sheet 10. Although not shown in the figure, if (tab-like) projections are provided around the periphery of the sheet with attached films 10, then the operation of removing the release films once they have been stuck to the sheet can be conducted with ease by using these tabs.

Next, as shown in FIG. 3(B), the release film 12 is removed from only one surface of the stamped out sheet with attached films 10, and the thus exposed surface of the sheet 11 is bonded to a component 20. The bonding of the component may either be conducted as the release film is removed, or conducted once the release film has been completely removed. The component may be any component that requires either heat radiation or conductivity. In particular, the sheet can be used for bonding a heat-generating electronic component such as a thyristor, and a heat radiating component (radiating fins) on which the heat-generating electronic component is mounted.

Subsequently, as shown in FIG. 3(C), the release sheet 12 is removed from the other surface, and another component 21 is bonded to the thus exposed surface of the sheet 11, thereby sandwiching the sheet 11 between the two components 20 and 21.

EXAMPLES

As follows is a description of the present invention based on a series of examples. In the following examples, average particle diameter was measured using a Mastersizer (manufactured by Malvern Instruments Ltd.). Tap density was measured using a Tap Denser (model KYT-1000, manufactured by Seishin Enterprise Co., Ltd.). Unless stated otherwise, the particle thickness and aspect ratio values were calculated from the average particle diameter and the specific surface area, and the particle relative packing density was calculated from the tap density. The spherical particles used in the following examples refer to substantially spherical particles. Conductor sheet resistance was measured using a resistance measuring device. Paste viscosity was measured using a HVT-type or RVT-type viscometer manufactured by Brookfield Engineering Laboratories, and the thixotropic index was calculated from the viscosity ratio that yielded a 10-fold difference in shear rate.

Unless stated otherwise, a V-blender with an internal capacity of 2 liters, a ball mill with an internal diameter of 200 mm and a length of 200 mm, a rocking mill with an internal capacity of 2 liters, and a planetary mixer with an internal capacity of 2 liters were used. Unless stated otherwise, mixing of conductive powders was conducted without the use of beads, by using interparticle collisions to achieve disaggregation of any aggregated particles and mixing of the different particles.

Example 1

Silver powder with an average particle diameter of 15 μm, a specific surface area of 0.11 m²/g, a relative packing density of 63%, a particle thickness of 2.3 μM, and an aspect ratio of 6.7 was used as the substantially monodispersed scale-like particles. Silver powder which contained aggregated particles, but which had a primary particle diameter of 1.1 μm, an aspect ratio of 1.2, and a relative packing density of 54% was used as the spherical particles. The particle diameter ratio between the scale-like particles and the spherical particles was approximately 14.

60 parts by weight of the above scale-like particles and 40 parts by weight of the spherical particles were mixed together for 96 hours in a V-blender, thereby achieving both disaggregation of the spherical particles and uniform dispersion of both particles, and yielding a mixed conductive powder. The volumetric ratio between the scale-like particles and the spherical particles was 60:40, the tap density of the mixed conductive powder was 7.76 g/cm³, and the relative packing density was 74%.

Example 2

Silver powder with an average particle diameter of 23 μm, a specific surface area of 0.09 m²/g, a relative packing density of 57%, a particle thickness of 2.6 μm, and an aspect ratio of 8.9 was used as the substantially monodispersed scale-like particles. Silver powder which contained aggregated particles, but which had a primary particle diameter of 1.0 μm, an aspect ratio of 1.1, and a relative packing density of 50% was used as the spherical particles. The particle diameter ratio between the scale-like particles and the spherical particles was 23.

55 parts by weight of the above scale-like particles and 45 parts by weight of the spherical particles were dispersed for 96 hours using a V-blender, yielding a mixed conductive powder. The volumetric ratio between the scale-like particles and the spherical particles was 55:45, the tap density of the mixed conductive powder was 7.55 g/cm³, and the relative packing density was 72%.

Example 3

Silver powder with an average particle diameter of 9 μm, a specific surface area of 0.12 m²/g, a relative packing density of 62%, a particle thickness of 2.5 μm, and an aspect ratio of 3.7 was used as the substantially monodispersed scale-like particles. Silver powder which contained aggregated particles, but which had a primary particle diameter of 1.3 μm, an aspect ratio of 1.0, and a relative packing density of 57% was used as the spherical particles. The particle diameter ratio between the scale-like particles and the spherical particles was approximately 7.

80 parts by weight of the above scale-like particles and 20 parts by weight of the spherical particles were mixed together for 60 hours using a ball mill, thereby achieving both disaggregation of the spherical particles and uniform dispersion of both particles, and yielding a mixed conductive powder. The volumetric ratio between the scale-like particles and the spherical particles was 80:20, the tap density of the mixed conductive powder was 7.34 g/cm³, and the relative packing density was 70%.

Example 4

Silver powder with an average particle diameter of 17 μm, a specific surface area of 0.11 m²/g, a relative packing density of 59%, a particle thickness of 2.2 μm, and an aspect ratio of 7.8 was used as the substantially monodispersed scale-like particles. Silver powder which contained aggregated particles, but which had a primary particle diameter of 0.8 μm, an aspect ratio of 1.1, and a relative packing density of 45% was used as the spherical particles. The particle diameter ratio between the scale-like particles and the spherical particles was approximately 21.

80 parts by weight of the above scale-like particles and 20 parts by weight of the spherical particles were mixed together for 36 hours in a rocking mill, thereby achieving both disaggregation of the spherical particles and uniform dispersion of both particles, and yielding a mixed conductive powder. The volumetric ratio between the scale-like particles and the spherical particles was 80:20, the tap density of the mixed conductive powder was 7.24 g/cm³, and the relative packing density was 69%.

Example 5

Silver powder with an average particle diameter of 16 μm, a specific surface area of 0.09 m²/g, a relative packing density of 63%, a particle thickness of 2.9 μm, and an aspect ratio of 5.6 was used as the substantially monodispersed scale-like particles. Silver powder which contained aggregated particles, but which had a primary particle diameter of 1.0 μm, an aspect ratio of 1.1, and a relative packing density of 48% was used as the spherical particles. The particle diameter ratio between the scale-like particles and the spherical particles was 16.

70 parts by weight of the above scale-like particles and 30 parts by weight of the spherical particles were dispersed for 96 hours using a V-blender, yielding a mixed conductive powder. The volumetric ratio between the scale-like particles and the spherical particles was 70:30, the tap density of the mixed conductive powder was 7.78 g/cm³, and the relative packing density was 74%.

Example 6

70 parts by weight of the scale-like particles used in the example 5 were used, and as the spherical particles, 20 parts by weight of the spherical silver powder used in the example 4 and 10 parts by weight of the spherical silver powder used in the example 5 were used. The particle diameter ratio between the scale-like particles and the spherical particles was 20 for the spherical silver powder used in the example 4, and 16 for the spherical silver powder used in the example 5.

The above particles were dispersed for 60 hours using a ball mill, yielding a mixed conductive powder. The volumetric ratio between the scale-like particles and the spherical particles was 70:30, the tap density of the mixed conductive powder was 7.80 g/cm³, and the relative packing density was 74%.

Example 7

Silver powder with an average particle diameter of 16 μm, a specific surface area of 0.08 m²/g, a relative packing density of 63%, a particle thickness of 3.4 μm, and an aspect ratio of 4.6 was used as the substantially monodispersed scale-like particles. As the spherical particles, the spherical silver powder used in the example 5 was used. The particle diameter ratio between the scale-like particles and the spherical particles was 16.

70 parts by weight of the above scale-like particles and 30 parts by weight of the spherical particles were dispersed for 96 hours using a V-blender, yielding a mixed conductive powder. The volumetric ratio between the scale-like particles and the spherical particles was 70:30, the tap density of the mixed conductive powder was 7.97 g/cm³, and the relative packing density was 76%.

Example 8

The scale-like particles used in the example 7 were used as the substantially monodispersed scale-like particles. Silver powder which contained aggregated particles, but which had a primary particle diameter of 0.7 μm, an aspect ratio of 1.1, and a relative packing density of 45% was used as the spherical particles. The particle diameter ratio between the scale-like particles and the spherical particles was approximately 23.

70 parts by weight of the above scale-like particles and 30 parts by weight of the spherical particles were dispersed for 96 hours using a V-blender, yielding a mixed conductive powder. The volumetric ratio between the scale-like particles and the spherical particles was 70:30, the tap density of the mixed conductive powder was 7.34 g/cm³, and the relative packing density was 70%.

Example 9

Silver powder with an average particle diameter of 18 μm, a specific surface area of 0.06 m²/g, a relative packing density of 64%, a particle thickness of 4.9 μm, and an aspect ratio of 3.7 was used as the substantially monodispersed scale-like particles. Silver powder which contained aggregated particles, but which had a primary particle diameter of 1.0 μm, an aspect ratio of 1.1, and a relative packing density of 53% was used as the spherical particles. The particle diameter ratio between the scale-like particles and the spherical particles was 18.

65 parts by weight of the above scale-like particles and 35 parts by weight of the spherical particles were dispersed for 96 hours using a V-blender, yielding a mixed conductive powder. The volumetric ratio between the scale-like particles and the spherical particles was 65:35, the tap density of the mixed conductive powder was 8.08 g/cm³, and the relative packing density was 77%.

Example 10

The scale-like silver powder used in the example 5 and the spherical silver powder used in the example 2 were used. The particle diameter ratio between the scale-like particles and the spherical particles was 16.

95 parts by weight of the above scale-like particles and 5 parts by weight of the spherical particles were dispersed for 120 hours using a V-blender, yielding a mixed conductive powder. The volumetric ratio between the scale-like particles and the spherical particles was 95:5, the tap density of the mixed conductive powder was 7.32 g/cm³, and the relative packing density was 70%.

Comparative Example 1

40 parts by weight of the scale-like silver powder used in the example 5 and 60 parts by weight of the spherical silver powder used in the example 5 were dispersed for 96 hours using a V-blender, yielding a mixed conductive powder. The volumetric ratio between the scale-like particles and the spherical particles was 40:60, the tap density of the mixed conductive powder was 6.82 g/cm³, and the relative packing density was 65%.

Comparative Example 2

20 parts by weight of the scale-like silver powder used in the example 5 and 80 parts by weight of the spherical silver powder used in the example 5 were dispersed for 96 hours using a V-blender, yielding a mixed conductive powder. The volumetric ratio between the scale-like particles and the spherical particles was 20:80, the tap density of the mixed conductive powder was 5.95 g/cm³, and the relative packing density was 57%.

Comparative Example 3

Silver powder with an average particle diameter of 10 μm, a specific surface area of 1.0 m²/g, a relative packing density of 41%, a particle thickness of 0.2 μm, and an aspect ratio of 51 was used as the substantially monodispersed scale-like particles. The spherical silver powder used in the example 5 was used as the spherical particles. The particle diameter ratio between the scale-like particles and the spherical particles was 10.

70 parts by weight of the above scale-like particles and 30 parts by weight of the spherical particles were dispersed for 36 hours using a rocking mill, yielding a mixed conductive powder. The volumetric ratio between the scale-like particles and the spherical particles was 70:30, the tap density of the mixed conductive powder was 4.72 g/cm³, and the relative packing density was 45%.

Comparative Example 4

The scale-like particles used in the example 4 were used as the scale-like particles. Silver powder which contained aggregated particles, but which had a primary particle diameter of 5.0 μm, an aspect ratio of 1.1, and a relative packing density of 52% was used as the spherical particles. The particle diameter ratio between the scale-like particles and the spherical particles was 3.4.

65 parts by weight of the above scale-like particles and 35 parts by weight of the spherical particles were dispersed for 96 hours using a V-blender, yielding a mixed conductive powder. The volumetric ratio between the scale-like particles and the spherical particles was 65:35, the tap density of the mixed conductive powder was 6.08 g/cm³, and the relative packing density was 58%.

Comparative Example 5

Silver powder with an average particle diameter of 7 μm, a specific surface area of 0.7 m²/g, a relative packing density of 43%, a particle thickness of 0.3 µm, and an aspect ratio of 24 was used as the substantially monodispersed scale-like particles. The spherical silver powder used in the example 5 was used as the spherical particles. The particle diameter ratio between the scale-like particles and the spherical particles was 7.

60 parts by weight of the above scale-like particles and 40 parts by weight of the spherical particles were dispersed for 60 hours using a ball mill, yielding a mixed conductive powder. The volumetric ratio between the scale-like particles and the spherical particles was 60:40, the tap density of the mixed conductive powder was 5.25 g/cm$^3$, and the relative packing density was 50%.

Comparative Example 6

The scale-like silver powder used in the example 1 was used as the scale-like particles. Silver powder which contained aggregated particles, but which had a primary particle diameter of 2.5 µm, an aspect ratio of 1.1, and a relative packing density of 52% was used as the spherical particles. The particle diameter ratio between the scale-like particles and the spherical particles was 6.

60 parts by weight of the above scale-like particles and 40 parts by weight of the spherical particles were dispersed for 36 hours using a rocking mill, yielding a mixed conductive powder. The volumetric ratio between the scale-like particles and the spherical particles was 60:40, the tap density of the mixed conductive powder was 6.4 g/cm$^3$, and the relative packing density was 61%.

(Binder Preparation)

10 parts by weight of an alkoxy group-containing resol-type phenol resin (trial product manufactured by Hitachi Chemical Co., Ltd., number of carbon atoms within alkoxy groups: 4, alkoxylation rate: 65%, weight average molecular weight: 1,200), 60 parts by weight of a bisphenol F epoxy resin with an epoxy equivalence of 170 g/eq (product name: Epomik R110, manufactured by Mitsui Chemicals, Inc.), 25 parts by weight of a monoepoxide (product name: Glycirol ED-509, manufactured by Asahi Denka Co., Ltd.), and 5 parts by weight of 2-phenyl-4-methyl-imidazole (product name: Curezol 2P4MZ, manufactured by Shikoku Chemicals Corp.) were mixed together uniformly, yielding a binder.

(Mixing with Binder—Paste Formation 1)

To separate 9 g samples of the binder obtained above was added 91 g of each of the mixed conductive powders obtained above in the examples 1 to 10 and the comparative examples 1 to 6, and each sample was mixed, and the conversion to a paste-like state was observed.

As a result, it was found that the samples that used the mixed conductive powders obtained in the examples 1, 5 and 6 were able to be uniformly mixed and formed into a paste with ease. The thus obtained pastes were labeled 1A, 5A and 6A respectively. The samples that used the mixed conductive powders obtained in the examples 2, 3, 4, 7 and 9 exhibited some increase in viscosity, but were still able to be mixed uniformly to form a paste. The samples that used the mixed conductive powders obtained in the examples 8 and 10 were very difficult to mix uniformly, but eventually formed a paste.

However, the samples that used the mixed conductive powders of the comparative examples 1 to 6 were unable to be mixed uniformly, and formed a dry mixture in each case.

(Mixing with Binder—Paste Formation 2)

To separate 5 g samples of the binder obtained above were added 2.0 g of ethylcarbitol as a solvent, and then 95 g of each of the mixed conductive powders obtained above in the examples 1 to 10 and the comparative examples 1 to 6, and each sample was then mixed.

As a result, it was found that the samples that used the mixed conductive powders obtained in the examples 1, 5, 6, 7 and 9 were able to be uniformly mixed and formed into a paste with ease. Of the thus obtained pastes, those that used the mixed conductive powders of the examples 1, 5 and 6 were labeled 1B, 5B and 6B respectively.

The samples that used the mixed conductive powders obtained in the examples 2, 3, 4, 8 and 10 exhibited some increase in viscosity, but were still able to be mixed uniformly to form a paste.

In contrast, the samples that used the mixed conductive powders obtained in the comparative examples 1 and 2 were very difficult to mix uniformly, but by adding a further 2 g of solvent, were eventually able to be mixed uniformly. The samples that used the mixed conductive powders of the comparative examples 3, 4, 5 and 6 were unable to be mixed uniformly, and formed a dry mixture in each case, and even with the addition of a further 2 g of solvent, uniform mixing was still impossible.

(Measurement of Thermal Conductivity)

Of the pastes obtained from the above paste formations operations 1 and 2, those of the examples 1, 5 and 6 from both series, which exhibited ready mixing with the binder, a total of 6 pastes (1A, 1B, 5A, 5B, 6A and 6B) were each applied, using a baker applicator, to the surface of a polyimide film of thickness 0.05 mm that had undergone surface treatment with a release agent, thus forming a strip-like sheet of width 50 mm and length 100 mm.

Subsequently, the temperature was raised to 160° C. at a rate of 2° C./minute, held at 160° C. for 30 minutes, further raised to 185° C. at a rate of 5° C./minute, and then held at 185° C. for 30 minutes, thus drying and curing the paste.

The thermal conductivity of the thus obtained sheet-like cured products was measured. The results were 1A: 22 W/m·K, 1B: 28 W/m·K, 5A: 25 W/m·K, 5B: 32 W/m·K, 6A: 26 W/m·K, and 6B: 31 W/m·K. Each of these results represents a thermal conductivity equivalent to approximately 15 to 20% of that of copper or silver, which is sufficiently high.

Example 11

Silver powder with an average particle diameter of 10 µm, an aspect ratio of 1.0, and a relative packing density of 62% was used as the substantially monodispersed spherical particles (the large particles). Silver powder with a primary particle diameter of 1.1 µm, an aspect ratio of 1.1, and a relative packing density of 55% was used as the aggregated spherical particles (the small particles). The particle diameter ratio between the large particles and the small particles was approximately 9.

58 parts by weight of the above large particles and 42 parts by weight of the small particles were mixed together for 120 hours in a V-blender, thereby achieving both disaggregation of the aggregated small particles and uniform dispersion of both particles, and yielding a mixed conductive powder. The volumetric ratio between the large particles and the small particles was 58:42, the tap density of the mixed conductive powder was 7.75 g/cm$^3$, and the relative packing density was 74%.

Example 12

Silver powder with an average particle diameter of 11 µm, an aspect ratio of 1.0, and a relative packing density of 63% was used as the substantially monodispersed spherical particles (the large particles). The spherical silver powder used in the example 5 was used as the aggregated spherical particles (the small particles). The particle diameter ratio between the large particles and the small particles was 11.

57 parts by weight of the above large particles and 43 parts by weight of the small particles were mixed together for 180 hours in a V-blender, yielding a mixed conductive powder. The volumetric ratio between the large particles and the small particles was 57:43, the tap density of the mixed conductive powder was 7.84 g/cm$^3$, and the relative packing density was 75%.

Example 13

Silver powder with an average particle diameter of 12 μm, an aspect ratio of 1.0, and a relative packing density of 64% was used as the substantially monodispersed spherical particles (the large particles). Silver powder with a primary particle diameter of 0.9 μm, an aspect ratio of 1.0, and a relative packing density of 55% was used as the aggregated spherical particles (the small particles). The particle diameter ratio between the large particles and the small particles was approximately 13.

79 parts by weight of the above large particles and 21 parts by weight of the small particles were mixed together for 180 hours in a ball mill, thereby achieving both disaggregation of the aggregated small particles and uniform dispersion of both particles, and yielding a mixed conductive powder. The volumetric ratio between the large particles and the small particles was 79:21, the tap density of the mixed conductive powder was 7.63 g/cm$^3$, and the relative packing density was 73%.

Example 14

Silver powder with an average particle diameter of 9 μm, an aspect ratio of 1.0, and a relative packing density of 61% was used as the substantially monodispersed spherical particles (the large particles). The spherical silver powder used in the example 4 was used as the aggregated spherical particles (the small particles). The particle diameter ratio between the large particles and the small particles was approximately 11.

76 parts by weight of the above large particles and 24 parts by weight of the small particles were mixed together for 250 hours in a rocking mill, thereby achieving both disaggregation of the aggregated small particles and uniform dispersion of both particles, and yielding a mixed conductive powder. The volumetric ratio between the large particles and the small particles was 76:24, the tap density of the mixed conductive powder was 7.57 g/cm$^3$, and the relative packing density was 72%.

Example 15

Silver powder with an average particle diameter of 12 μm, an aspect ratio of 1.0, and a relative packing density of 63% was used as the substantially monodispersed spherical particles (the large particles). Silver powder with a primary particle diameter of 1.0 μm, an aspect ratio of 1.1, and a relative packing density of 52% was used as the aggregated spherical particles (the small particles). The particle diameter ratio between the large particles and the small particles was 12.

68 parts by weight of the above large particles and 32 parts by weight of the small particles were mixed together for 240 hours in a V-blender, yielding a mixed conductive powder. The volumetric ratio between the large particles and the small particles was 68:32, the tap density of the mixed conductive powder was 7.87 g/cm$^3$, and the relative packing density was 75%.

Example 16

Silver powder with an average particle diameter of 6 μm, an aspect ratio of 1.0, and a relative packing density of 62% was used as the substantially monodispersed spherical particles (the large particles). The aggregated spherical silver powder used in the example 15 was used as the aggregated spherical particles (the small particles). The particle diameter ratio between the large particles and the small particles was 6.

75 parts by weight of the above large particles and 25 parts by weight of the small particles were mixed together for 264 hours in a V-blender, yielding a mixed conductive powder. The volumetric ratio between the large particles and the small particles was 75:25, the tap density of the mixed conductive powder was 7.42 g/cm$^3$, and the relative packing density was 71%.

Example 17

The large particles used in the example 16 were used as the substantially monodispersed spherical particles (the large particles). Silver powder with a primary particle diameter of 0.8 μm, an aspect ratio of 1.1, and a relative packing density of 48% was used as the aggregated spherical particles (the small particles). The particle diameter ratio between the large particles and the small particles was 7.5.

73 parts by weight of the above large particles and 27 parts by weight of the small particles were mixed together for 180 hours in a V-blender, yielding a mixed conductive powder. The volumetric ratio between the large particles and the small particles was 73:27, the tap density of the mixed conductive powder was 7.41 g/cm$^3$, and the relative packing density was 71%.

Example 18

The large particles used in the example 16 were used as the substantially monodispersed spherical particles (the large particles). The small particles used in the example 17 were used as the aggregated spherical particles (the small particles). The particle diameter ratio between the large particles and the small particles was 7.5.

61 parts by weight of the above large particles and 39 parts by weight of the small particles were mixed together for 180 hours in a V-blender, yielding a mixed conductive powder. The volumetric ratio between the large particles and the small particles was 61:39, the tap density of the mixed conductive powder was 7.26 g/cm$^3$, and the relative packing density was 69%.

Comparative Example 7

61 parts by weight of the large particles used in the example 11, and 39 parts by weight of the small particles used in the example 11 were mixed together in a V-blender for 0.05 hours, yielding a mixed conductive powder. The volumetric ratio between the large particles and the small particles was 61:39, the tap density of the mixed conductive powder was 6.37 g/cm$^3$, and the relative packing density was 61%.

Comparative example 8

28 parts by weight of the large particles used in the example 12, and 72 parts by weight of the small particles used in the example 12 were mixed together in a V-blender for 0.1 hours, yielding a mixed conductive powder. The volumetric ratio between the large particles and the small particles was 28:72, the tap density of the mixed conductive powder was 5.68 g/cm³, and the relative packing density was 54%.

Comparative Example 9

33 parts by weight of the large particles used in the example 16, and 67 parts by weight of the small particles used in the example 16 were mixed together in a V-blender for 1 hour, yielding a mixed conductive powder. The volumetric ratio between the large particles and the small particles was 33:67, the tap density of the mixed conductive powder was 5.62 g/cm³, and the relative packing density was 54%.

Comparative Example 10

58 parts by weight of the large particles used in the example 16, and 42 parts by weight of the small particles used in the example 16 were mixed together in a V-blender for 0.1 hours, yielding a mixed conductive powder. The volumetric ratio between the large particles and the small particles was 58:42, the tap density of the mixed conductive powder was 5.84 g/cm³, and the relative packing density was 56%.

Comparative Example 11

93 g of the large particles used in the example 16, 207 g of the small particles used in the example 12, and 2 kg of zirconia beads of diameter 0.2 mm were placed inside a ball mill with an internal capacity of 2 liters, and rotated and mixed for 2 hours, yielding a mixed conductive powder. The volumetric ratio between the large particles and the small particles was 31:69, the tap density of the mixed conductive powder was 5.90 g/cm³, and the relative packing density was 56%.
(Binder Preparation and Paste Formation)

55 parts by weight of the aforementioned bisphenol F epoxy resin (product name: Epomik R110), 40 parts by weight of the aforementioned monoepoxide (product name: Glycirol ED-509), and 5 parts by weight of the aforementioned 2-phenyl-4-methyl-imidazole (product name: Curezol 2P4MZ) were mixed together uniformly, yielding a binder.

To separate 9 g samples of the thus obtained binder was added and mixed 91 g of each of the mixed conductive powders obtained above in the examples 11 to 18 and the comparative examples 7 to 11.

As a result, it was found that the samples that used the mixed conductive powders of the examples 11 to 18 were able to be uniformly mixed and formed into a paste. In contrast, the mixed conductive powders of the comparative examples 7 to 11 did not form pastes, that is, they were unable to be mixed uniformly, and formed dry lumps of extremely high viscosity.

Example 19

The scale-like silver powder used in the example 1 was used as the substantially monodispersed particles (the large particles). The spherical silver powder used in the example 11 was used as the aggregated particles (the small particles). The particle diameter ratio between the scale-like silver powder and the spherical silver powder was approximately 14.

60 parts by weight of the above scale-like silver powder, and 40 parts by weight of the spherical silver powder were mixed together in a V-blender for 96 hours, yielding a mixed conductive powder. The volumetric ratio between the scale-like silver powder and the spherical silver powder was 60:40, the tap density of the mixed conductive powder was 7.76 g/cm³, and the relative packing density was 74%.

Example 20

The scale-like silver powder used in the example 2 was used as the substantially monodispersed particles (the large particles). The spherical silver powder used in the example 5 was used as the aggregated particles (the small particles). The particle diameter ratio between the scale-like silver powder and the spherical silver powder was 23.

55 parts by weight of the above scale-like silver powder, and 45 parts by weight of the spherical silver powder were mixed together in a V-blender for 196 hours, yielding a mixed conductive powder. The volumetric ratio between the scale-like silver powder and the spherical silver powder was 55:45, the tap density of the mixed conductive powder was 7.55 g/cm³, and the relative packing density was 72%.

Example 21

A spherical silver-coated copper powder (product name: GB05K, manufactured by Hitachi Chemical Co., Ltd., average particle diameter: 5.5 µm, aspect ratio: 1.0, relative packing density: 64%) was used as the substantially monodispersed particles (the large particles). This silver-coated copper powder comprises a copper powder coated with 20% by weight of silver relative to the copper powder, in which both a portion of the copper powder and a silver-copper alloy are exposed, the fatty acid stearic acid has been adhered to (coated on) the surface of the powder in a quantity equivalent to 0.1% by weight relative to the silver-coated copper powder, and the silver coating layer has then been subjected to a smoothing treatment using a ball, so that the powder is substantially disaggregated. The spherical silver powder used in the example 5 was used as the aggregated particles (the small particles).

680 g of the above spherical silver-coated copper powder and 320 g of the spherical silver powder were weighed, and then placed inside a ball mill with an internal capacity of 3 liters and rotated for 100 hours, thereby achieving both disaggregation of the aggregated particles and uniform dispersion of both particles, and yielding a mixed conductive powder. The volumetric ratio between the spherical silver-coated copper powder and the spherical silver powder was 71:29, the tap density of the mixed conductive powder was 6.75 g/cm³, and the relative packing density was 70%.

In this example, the aspect ratio was measured in the following manner. 8 g of a base resin (No. 10-8130) and 2 g of a hardener (No. 10-8132) of a low viscosity epoxy resin (manufactured by Buehler Ltd.) were mixed together, 2 g of the mixed conductive powder was then added and dispersed thoroughly, and following vacuum defoaming at 25° C., the sample was allowed to stand for 10 hours at 25° C., thus causing the particles to settle and the resin to cure. Subsequently, the thus obtained cured product was cut in the vertical direction, the cut surface was magnified 1000-fold under a microscope, the major axis/minor axis ratio was determined for 150 individual particles visible at the cut surface, and the average value of these ratios was used as the aspect ratio. The minor axis is the settling direction, and the major axis is the direction perpendicular to the settling direction.

Example 22

A spherical silver-coated copper powder (product name: GB 10K, manufactured by Hitachi Chemical Co., Ltd., average particle diameter: 11.8 μm, aspect ratio: 1.0, relative packing density: 64%) was used as the substantially monodispersed particles (the large particles). This silver-coated copper powder comprises a copper powder coated with 20% by weight of silver relative to the copper powder, in which both a portion of the copper powder and a silver-copper alloy are exposed, the fatty acid stearic acid has been adhered to (coated on) the surface of the powder in a quantity equivalent to 0.1% by weight relative to the silver-coated copper powder, and the silver coating layer has then been subjected to a smoothing treatment using a ball, so that the powder is substantially disaggregated. The spherical silver powder used in the example 5 was used as the aggregated particles (the small particles).

700 g of the above spherical silver-coated copper powder and 320 g of the spherical silver powder were weighed, and then mixed in a ball mill in the same manner as the example 21 (although the mixing time was 200 hours), thus yielding a mixed conductive powder. The volumetric ratio between the spherical silver-coated copper powder and the spherical silver powder was 71:29, the tap density of the mixed conductive powder was 7.21 g/cm$^3$, and the relative packing density was 75%.

Example 23

A scale-like silver-coated copper powder (product name: MA10G, manufactured by Hitachi Chemical Co., Ltd., average particle diameter: 13 μm, specific surface area: 0.07 m$^2$/g, relative packing density: 64%, particle thickness: 3.5 μm, aspect ratio: 2.8) was used as the substantially monodispersed particles (the large particles). This scale-like MA powder comprises a copper powder coated with 20% by weight of silver relative to the copper powder, in which both a portion of the copper powder and a silver-copper alloy are exposed, the fatty acid stearic acid has been adhered to (coated on) the surface of the powder in a quantity equivalent to 0.1% by weight relative to the silver-coated copper powder, and the silver coating layer has then been subjected to smoothing treatment and scale formation treatment using a ball, so that the powder is substantially disaggregated. A spherical silver powder with a primary particle diameter of 1.1 μm, an aspect ratio of 1.0, and a relative packing density of 46% was used as the aggregated spherical particles (the small particles). The particle diameter ratio between the scale-like MA powder and the spherical silver powder was 12.

65 parts by weight of the above scale-like MA powder, and 35 parts by weight of the spherical silver powder were mixed together in a V-blender for 250 hours, yielding a mixed conductive powder. The volumetric ratio between the scale-like MA powder and the spherical silver powder was 68:32, the tap density of the mixed conductive powder was 7.05 g/cm$^3$, and the relative packing density was 75%.

Comparative Example 12

60 parts by weight of the scale-like silver powder and 40 parts by weight of the spherical silver powder, both of which were used in the example 19, were placed in a planetary mixer and mixed for 2 minutes, thus yielding a mixed conductive powder. The volumetric ratio between the scale-like silver powder and the spherical silver powder was 60:40, the tap density of the mixed conductive powder was 6.15 g/cm$^3$, and the relative packing density was 59%.

Comparative Example 13

55 parts by weight of the scale-like silver powder and 45 parts by weight of the spherical silver powder, both of which were used in the example 20, were placed in a planetary mixer and mixed for 2 minutes, thus yielding a mixed conductive powder. The volumetric ratio between the scale-like silver powder and the spherical silver powder was 55:45, the tap density of the mixed conductive powder was 5.79 g/cm$^3$, and the relative packing density was 55%.

Comparative Example 14

680 g of the spherical silver-coated copper powder (product name: GB05K) and 320 g of the spherical silver powder, both of which were used in the example 21, were placed in a planetary mixer and mixed for 2 minutes, thus yielding a mixed conductive powder. The volumetric ratio between the spherical silver-coated copper powder and the spherical silver powder was 71:29, the tap density of the mixed conductive powder was 5.41 g/cm$^3$, and the relative packing density was 56%.

Comparative example 15

670 g of the spherical silver-coated copper powder (product name: GB10K) and 330 g of the spherical silver powder, both of which were used in the example 22, were placed in a planetary mixer and mixed for 2 minutes, thus yielding a mixed conductive powder. The volumetric ratio between the spherical silver-coated copper powder and the spherical silver powder was 70:30, the tap density of the mixed conductive powder was 5.79 g/cm$^3$, and the relative packing density was 60%.

Comparative Example 16

65 parts by weight of the scale-like MA powder (product name: MA10G) and 35 parts by weight of the spherical silver powder, both of which were used in the example 23, were placed in a planetary mixer and mixed for 2 minutes, thus yielding a mixed conductive powder. The volumetric ratio between the spherical silver-coated copper powder and the spherical silver powder was 68:32, the tap density of the mixed conductive powder was 5.71 g/cm$^3$, and the relative packing density was 59%.

Comparative Example 17

60 parts by weight of the scale-like silver powder and 40 parts by weight of the spherical silver powder, both of which were used in the example 19, and 2 kg of zirconia beads of diameter 0.2 mm were placed inside a ball mill with an internal capacity of 3 liters, and rotated and mixed for 1 hour, yielding a mixed conductive powder. The volumetric ratio between the scale-like silver powder and the spherical silver powder was 60:40, the tap density of the mixed conductive powder was 5.63 g/cm$^3$, and the relative packing density was 54%. In this experiment, the zirconia beads and the mixed conductive powder were separated by sieving, but the separation was troublesome and took considerable time.

Comparing the mixed conductive powders obtained in the examples 19 to 23 and the mixed conductive powders obtained in the comparative examples 12 to 17 it was evident that whereas the mixed conductive powders of the examples 19 to 23 exhibited relative packing densities from 70 to 75%, the mixed conductive powders obtained in the comparative examples 12 to 17 had relative packing densities that were limited to 54 to 60%. In addition, the mixed conductive powder obtained in the comparative example 17, in which mixing and dispersion were conducted using fine zirconia beads with a diameter of 0.2 mm, exhibited a relative packing density of 56% after 1 hour of treatment, and a relative packing density of only 54% after 2 hours of treatment, indicating a fall, although slight, in the relative packing density with the passage of time.

Example 24

680 g of the spherical silver-coated copper powder (product name: GB05K) used in the example 21, and 320 g of a spherical silver powder which contained aggregated particles, but which had a primary particle diameter of 1.4 µm, an aspect ratio of 1.1, and a relative packing density of 58% were weighed, and then placed inside a ball mill with an internal capacity of 3 liters, and rotated for 100 hours, thereby achieving both disaggregation of the aggregated particles and uniform dispersion of both particles, and yielding a mixed conductive powder. The volumetric ratio between the spherical silver-coated copper powder and the spherical silver powder was 71:29, the tap density of the mixed conductive powder was 6.84 g/cm$^3$, and the relative packing density was 71%.

38 parts by weight of the aforementioned alkoxy group-containing resol-type phenol resin (the same trial product described above, manufactured by Hitachi Chemical Co., Ltd.), 57 parts by weight of the aforementioned bisphenol F epoxy resin (product name: Epomik R110), and 5 parts by weight of the aforementioned 2-phenyl-4-methyl-imidazole (product name: Curezol 2P4MZ) were mixed together uniformly, yielding a binder.

To 40 g of the thus obtained binder were added 460 g of the mixed conductive powder obtained above and 15 g of ethylcarbitol as a solvent, and the mixture was then mixed and dispersed uniformly for 3 minutes in an agitation-type stone mill, and then for 5 minutes in a three roll mill, thus yielding a conductive paste. The viscosity of the obtained paste at 25° C. was 490 dPa·s, and the thixotropic index was 5.

(Test Substrate Preparation and Evaluation of Characteristics)

Figure 4:
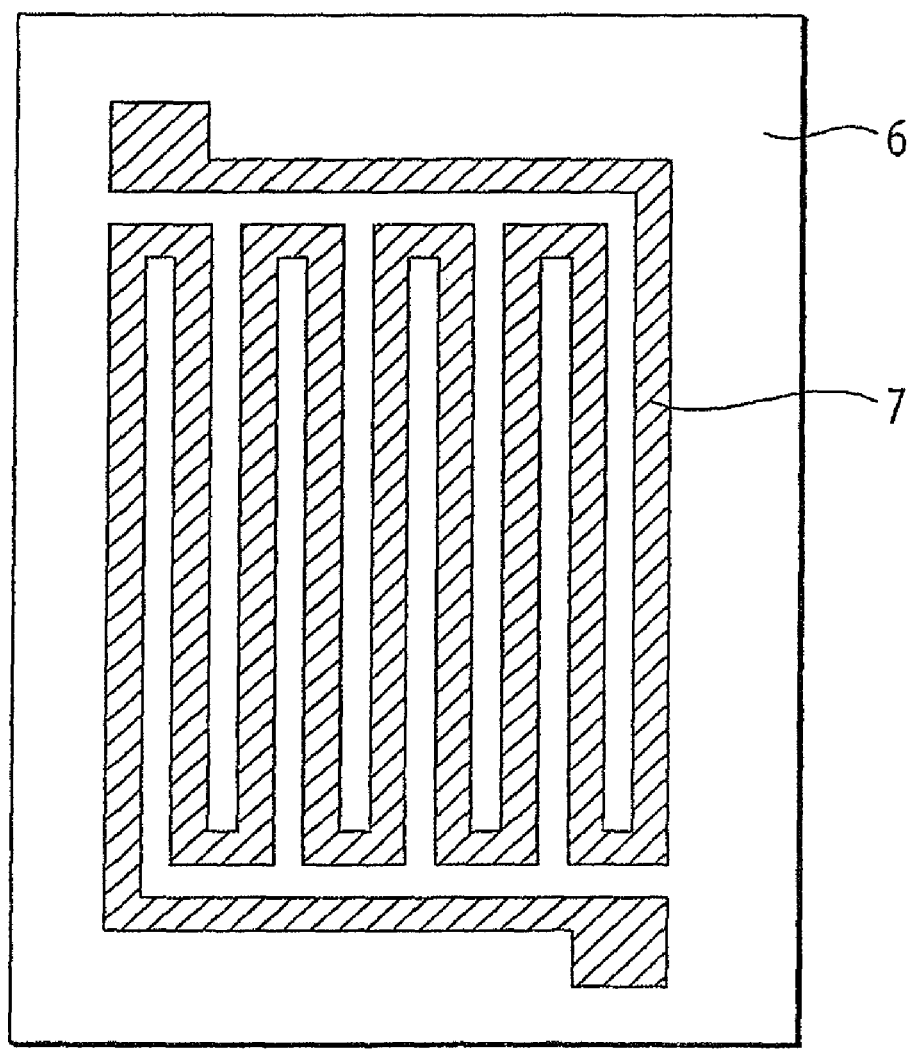
FIG. 4 is a plan view showing a test pattern formed on a polyimide film.

Next, using the thus obtained conductive paste, a test pattern 7 (circuit width 0.7 mm, circuit length 135 mm) shown in FIG. 4 was printed onto a polyimide film 6, and the substrate was then placed in a dryer, the temperature was raised to 170° C. over a period of 13 minutes, and heat treatment was conducted at 170° C. for 1 hour, thus yielding a test substrate.

Measurement of the sheet resistance of the conductor for the thus obtained test substrate revealed a result of 86 mΩ/sq. Using this test substrate, reliability tests were conducted, including a 4,000 hour constant temperature and humidity test, and 3,000 cycles of a thermal shock test (gas phase), and the results showed variations in the circuit resistance of 8.7% and 8.2% respectively. The constant temperature and humidity test involved storage at 85° C. and a relative humidity of 85%, whereas each cycle of the thermal shock test (gas phase) involved storage at −65° C. for 30 minutes and then at 125° C. for 30 minutes (this also applies below).

In a separate preparation, the obtained conductive paste was used to print comb-shaped electrodes onto a glass substrate of thickness 1.0 mm, with a distance between the opposing electrodes of 2.0 mm, and heat treatment and curing were then conducted under the same conditions as those described above, thus forming a migration resistance test substrate.

The migration resistance of this test substrate was tested using a water drop method (this also applies below). In other words, filter paper was placed on the electrodes of the test substrate, and following dripping of distilled water onto the filter paper to wet it, a 20 V bias voltage was applied across the electrodes, and the short circuit current was measured. Measurement of the time taken for the short circuit current to reach 50 mA (hereafter this is referred to as the short circuit time) revealed a result of 9 minutes and 20 seconds, which was an excellent result, and was more than 20 times that of the 26 seconds for a silver paste that used silver powder as the conductive powder (hereafter, this paste is referred to as the comparative silver paste).

Example 25

600 g of the spherical silver-coated copper powder (product name: GB05K) used in the example 21, and 400 g of a spherical silver powder which contained aggregated particles, but which had a primary particle diameter of 0.95 µm, an aspect ratio of 1.1, and a relative packing density of 51% were weighed, and then using the same ball mill as the example 24, were mixed for 180 hours under the same conditions as the example 24, thus yielding a mixed conductive powder. The volumetric ratio between the spherical silver-coated copper powder and the spherical silver powder was 63:37, the tap density of the mixed conductive powder was 6.82 g/cm$^3$, and the relative packing density was 70%.

Using the thus obtained mixed conductive powder, a conductive paste was prepared in the same manner as the example 24. The viscosity of the thus obtained conductive paste at 25° C. was 510 dPa·s, and the thixotropic index was 5.

Using this conductive paste, test substrates were prepared in the same manner as the example 24, and the various characteristics were evaluated in the same manner as the example 24. The results revealed a sheet resistance of 82 mΩ/sq., variations in the circuit resistance following the constant temperature and humidity test and the thermal shock test (gas phase) of 8.5% and 8.3% respectively, and a short circuit time of 8 minutes and 50 seconds (more than 20 times that of the comparative silver paste).

Example 26

770 g of the spherical silver-coated copper powder (product name: GB05K) used in the example 21, and 230 g of a spherical silver powder which contained aggregated particles, but which had a primary particle diameter of 1.3 µm, an aspect ratio of 1.1, and a relative packing density of 56% were weighed, and then using the same ball mill as the example 24, were mixed for 200 hours under the same conditions as the example 24, thus yielding a mixed conductive powder. The volumetric ratio between the spherical silver-coated copper powder and the spherical silver powder was 79:21, the tap density of the mixed conductive powder was 6.86 g/cm$^3$, and the relative packing density was 72%.

Using the thus obtained mixed conductive powder, a conductive paste was prepared in the same manner as the example 24. The viscosity of the thus obtained conductive paste at 25° C. was 340 dPa·s, and the thixotropic index was 5.

Using this conductive paste, test substrates were prepared in the same manner as the example 24, and the various characteristics were evaluated in the same manner as the example 24. The results revealed a sheet resistance of 81 mΩ/sq., variations in the circuit resistance following the constant temperature and humidity test and the thermal shock test (gas phase) of 7.5% and 7.3% respectively, and a short circuit time of 9 minutes and 20 seconds (more than 20 times that of the comparative silver paste).

Example 27

650 g of the spherical silver-coated copper powder (product name: GB10K) used in the example 22, and 350 g of the spherical silver powder used in the example 24 were weighed, and then using the same ball mill as the example 24, were mixed for 200 hours under the same conditions as the example 24, thus yielding a mixed conductive powder. The volumetric ratio between the spherical silver-coated copper powder and the spherical silver powder was 68:32, the tap density of the mixed conductive powder was 7.25 g/cm$^3$, and the relative packing density was 75%.

Using the thus obtained mixed conductive powder, a conductive paste was prepared in the same manner as the example 24. The viscosity of the thus obtained conductive paste at 25° C. was 290 dPa·s, and the thixotropic index was 5.

Using this conductive paste, test substrates were prepared in the same manner as the example 24, and the various characteristics were evaluated in the same manner as the example 24. The results revealed a sheet resistance of 52 mΩ/sq., variations in the circuit resistance following the constant temperature and humidity test and the thermal shock test (gas phase) of 4.5% and 4.3% respectively, and a short circuit time of 9 minutes and 40 seconds (more than 20 times that of the comparative silver paste).

Example 28

700 g of the spherical silver-coated copper powder (product name: GB 10K) used in the example 22, and 300 g of the spherical silver powder used in the example 25 were weighed, and then using the same ball mill as the example 24, were mixed for 200 hours under the same conditions as the example 24, thus yielding a mixed conductive powder. The volumetric ratio between the spherical silver-coated copper powder and the spherical silver powder was 73:27, the tap density of the mixed conductive powder was 7.19 g/cm$^3$, and the relative packing density was 75%.

50 parts by weight of a bisphenol AD epoxy resin (product name: Epomik R710, manufactured by Mitsui Chemicals, Inc.), 50 parts by weight of a bisphenol F epoxy resin (product name: Epiclon EXA830CRP, manufactured by Dainippon Ink and Chemicals, Incorporated), 50 parts by weight of the aforementioned monoepoxide (product name: ED-509), and 30 parts by weight of the aforementioned 2-phenyl-4-methyl-imidazole (product name: Curezol 2P4MZ) were mixed together uniformly, yielding a binder.

To 25 g of the thus obtained binder was gradually added 475 g of the mixed conductive powder obtained above, and the mixture was then mixed and dispersed uniformly for 5 minutes in an agitation-type stone mill, thus yielding a conductive paste. The viscosity of the obtained conductive paste at 25° C. was 1200 dPa·s, and the thixotropic index was 5.

Using this conductive paste, test substrates were prepared in the same manner as the example 24, and the various characteristics were evaluated in the same manner as the example 24. The results revealed a sheet resistance of 35 mΩ/sq., variations in the circuit resistance following the constant temperature and humidity test and the thermal shock test (gas phase) of 2.5% and 1.8% respectively, and a short circuit time of 8 minutes and 50 seconds (more than 20 times that of the comparative silver paste).

Comparative Example 18

540 g of the spherical silver-coated copper powder (product name: GB05K) used in the example 21, and 60 g of the spherical silver powder used in the example 24 were weighed, and then using the same ball mill as the example 24, were mixed for 100 hours under the same conditions as the example 24, thus yielding a mixed conductive powder. The volumetric ratio between the spherical silver-coated copper powder and the spherical silver powder was 91:9, the tap density of the mixed conductive powder was 6.13 g/cm$^3$, and the relative packing density was 66%.

Using the thus obtained mixed conductive powder, a conductive paste was prepared in the same manner as the example 24. The viscosity of the thus obtained conductive paste at 25° C. was 710 dPa·s, and the thixotropic index was 4.7.

Using this conductive paste, test substrates were prepared in the same manner as the example 24, and the various characteristics were evaluated in the same manner as the example 24. The results revealed a sheet resistance of 130 mΩ/sq., and variations in the circuit resistance following the constant temperature and humidity test and the thermal shock test (gas phase) of 46.3% and 44.8% respectively, which were significantly higher values than those observed in the examples 24 to 28. The short circuit time was 11 minutes and 20 seconds (more than 20 times that of the comparative silver paste).

Comparative Example 19

300 g of the spherical silver-coated copper powder (product name: GB05K) used in the example 21, and 700 g of the spherical silver powder used in the example 26 were weighed, and then using the same ball mill as the example 24, were mixed for 100 hours under the same conditions as the example 24, thus yielding a mixed conductive powder. The volumetric ratio between the spherical silver-coated copper powder and the spherical silver powder was 33:67, the tap density of the mixed conductive powder was 6.13 g/cm$^3$, and the relative packing density was 61%.

Using the thus obtained mixed conductive powder, a conductive paste was prepared in the same manner as the example 24. The viscosity of the thus obtained conductive paste at 25° C. was 930 dPa·s, and the thixotropic index was 4.5.

Using this conductive paste, test substrates were prepared in the same manner as the example 24, and the various characteristics were evaluated in the same manner as the example 24. The results revealed a sheet resistance of 65 mΩ/sq., and variations in the circuit resistance following the constant temperature and humidity test and the thermal shock test (gas phase) of 4.9% and 5.2% respectively. The short circuit time was 4 minutes and 20 seconds (10 times that of the comparative silver paste), which was less than half the value observed in each of the examples.

Comparative Example 20

400 g of the spherical silver-coated copper powder (product name: GB05K) used in the example 21, and 600 g of the spherical silver powder used in the example 25 were weighed, and then using the same ball mill as the example 24, were mixed for 200 hours under the same conditions as the example 24, thus yielding a mixed conductive powder. The volumetric ratio between the spherical silver-coated copper powder and the spherical silver powder was 43:57, the tap density of the mixed conductive powder was 6.43 g/cm$^3$, and the relative packing density was 65%.

Using the thus obtained mixed conductive powder, a conductive paste was prepared in the same manner as the example 24. The viscosity of the thus obtained conductive paste at 25° C. was 790 dPa·s, and the thixotropic index was 5.1.

Using this conductive paste, test substrates were prepared in the same manner as the example 24, and the various characteristics were evaluated in the same manner as the example 24. The results revealed a sheet resistance of 80 mΩ/sq., and variations in the circuit resistance following the constant temperature and humidity test and the thermal shock test (gas phase) of 5.6% and 5.1% respectively. The short circuit time was 5 minutes and 20 seconds (approximately 12 times that of the comparative silver paste), which was shorter than all of the examples.

Example 29

The scale-like silver powder used in the example 1 was used as the substantially monodispersed scale-like particles. Silver powder which contained aggregated particles, but which had a primary particle diameter of 1.1 μm, an aspect ratio of 1.1, and a relative packing density of 53% was used as the spherical particles. The particle diameter ratio between the scale-like particles and the spherical particles was approximately 14.

60 parts by weight of the above scale-like particles and 40 parts by weight of the spherical particles were mixed together for 270 hours in a V-blender, thereby achieving both disaggregation of the spherical particles and uniform dispersion of both particles, and yielding a mixed conductive powder. The volumetric ratio between the scale-like particles and the spherical particles was 60:40, the tap density of the mixed conductive powder was 8.12 g/cm$^3$, and the relative packing density was 77%.

To 25 g of the same binder as that used in the example 28 was gradually added 475 g of the mixed conductive powder obtained above, and the mixture was then mixed and dispersed in the same manner as the example 28, thus yielding a conductive paste. The viscosity of the obtained conductive paste at 25° C. was 1150 dPa·s, and the thixotropic index was 5.0.

Using this conductive paste, test substrates were prepared in the same manner as the example 24, and the various characteristics were evaluated in the same manner as the example 24. The results revealed a sheet resistance of 34 mΩ/sq., variations in the circuit resistance following the constant temperature and humidity test and the thermal shock test (gas phase) of 0.8% and 0.6% respectively, and a short circuit time of 10 minutes and 20 seconds (more than 20 times that of the comparative silver paste).

Furthermore, following printing of a test pattern, the temperature was raised to 190° C. over a period of 5 minutes using a far infrared dryer, and heat treatment was then conducted by holding the temperature at 190° C. for 10 minutes, thus forming a test substrate. The sheet resistance of this test substrate was 27 mΩ/sq., and the variations in the circuit resistance following the constant temperature and humidity test and the thermal shock test (gas phase) were 0.4% and 0.5% respectively.

Comparative Example 21

To 25 g of the same binder as that used in the example 28 were added 285 g of the scale-like particles used in the example 29, and 190 g of the aggregated spherical particles used in the example 29, and the mixture was then mixed and dispersed using an agitation-type stone mill, but the viscosity was high, and uniform mixing was impossible. The volumetric ratio between the scale-like particles and the spherical particles was 60:40, the same as in the example 29.

Example 30

The scale-like silver powder used in the example 3 was used as the substantially monodispersed scale-like particles. The spherical particles used in the example 29 were used as the spherical particles. The particle diameter ratio between the scale-like particles and the spherical particles was approximately 8.

80 parts by weight of the above scale-like particles and 20 parts by weight of the spherical particles were mixed together for 160 hours using a ball mill, thus yielding a mixed conductive powder. The volumetric ratio between the scale-like particles and the spherical particles was 80:20, the tap density of the mixed conductive powder was 7.67 g/cm$^3$, and the relative packing density was 73%.

To 30 g of the same binder as that used in the example 28 was gradually added 470 g of the mixed conductive powder obtained above, and the mixture was then mixed and dispersed in the same manner as the example 28, thus yielding a conductive paste. The viscosity of the obtained conductive paste at 25° C. was 960 dPa·s, and the thixotropic index was 5.0.

Using this conductive paste, test substrates were prepared in the same manner as the example 24, and the various characteristics were evaluated in the same manner as the example 24. The results revealed a sheet resistance of 36 mΩ/sq., variations in the circuit resistance following the constant temperature and humidity test and the thermal shock test (gas phase) of 0.9% and 0.7% respectively, and a short circuit time of 11 minutes and 30 seconds (more than 20 times that of the comparative silver paste).

Comparative Example 22

To 30 g of the same binder as that used in the example 28 were added 376 g of the scale-like particles used in the example 30, and 94 g of the aggregated spherical particles used in the example 29, and the mixture was then mixed and dispersed using an agitation-type stone mill, but the viscosity was high, and uniform mixing was impossible. The volumetric ratio between the scale-like particles and the spherical particles was 80:20, the same as in the example 30.

Example 31

750 parts by weight of the spherical silver-coated copper powder (product name: GB05K) used in the example 21, and 250 parts by weight of the aggregated spherical particles used in the example 4 were mixed for 200 hours using a rocking mill with an internal capacity of 4 liters, thus yielding a mixed conductive powder. The volumetric ratio between the spherical silver-coated copper powder and the spherical particles was 77:23, the tap density of the mixed conductive powder was 6.78 g/cm$^3$, and the relative packing density was 71%.

To 35 g of the same binder as that used in the example 28 was gradually added 465 g of the mixed conductive powder obtained above, and the mixture was then mixed and dispersed in the same manner as the example 28, thus yielding a conductive paste. The viscosity of the obtained conductive paste at 25° C. was 1030 dPa·s, and the thixotropic index was 4.9.

Using this conductive paste, test substrates were prepared in the same manner as the example 24, and the various characteristics were evaluated in the same manner as the example 24. The results revealed a sheet resistance of 38 mΩ/sq., variations in the circuit resistance following the constant temperature and humidity test and the thermal shock test (gas phase) of 0.8% and 1.1% respectively, and a short circuit time of 9 minutes and 40 seconds (more than 20 times that of the comparative silver paste).

Furthermore, when an attempt was made to fill via holes of diameter 0.2 mm formed in a double-sided copper clad laminate of thickness 0.4 mm by printing the conductive paste, filling was able to be achieved.

Comparative Example 23

To 35 g of the same binder as that used in the example 28 were added 348.75 g of the scale-like particles used in the example 31, and 116.25 g of the aggregated spherical particles used in the example 31, and the mixture was then mixed and dispersed using an agitation-type stone mill, but the viscosity was high, and uniform mixing was impossible. The volumetric ratio between the scale-like particles and the spherical particles was 77:23, the same as in the example 31.

Example 32

The spherical silver-coated copper powder (product name: GB10K) used in the example 22 was used as the substantially monodispersed particles. A spherical silver powder which contained aggregated particles, but which had a primary particle diameter of 1.1 µm, an aspect ratio of 1.1, and a relative packing density of 50% was used as the spherical particles. The particle diameter ratio between the spherical silver-coated copper powder and the spherical particles was approximately 10.

700 parts by weight of the above spherical silver-coated copper powder, and 300 parts by weight of the spherical particles were mixed for 200 hours in a ball mill with an internal capacity of 4 liters, thus yielding a mixed conductive powder. The volumetric ratio between the spherical silver-coated copper powder and the spherical particles was 73:27, the tap density of the mixed conductive powder was 7.21 g/cm$^3$, and the relative packing density was 75%.

To 25 g of the same binder as that used in the example 28 was gradually added 475 g of the mixed conductive powder obtained above, and the mixture was then mixed and dispersed in the same manner as the example 28, thus yielding a conductive paste. The viscosity of the obtained conductive paste at 25° C. was 1030 dPa·s, and the thixotropic index was 4.9.

Using this conductive paste, test substrates were prepared in the same manner as the example 24, and the various characteristics were evaluated in the same manner as the example 24. The results revealed a sheet resistance of 32 mΩ/sq., variations in the circuit resistance following the constant temperature and humidity test and the thermal shock test (gas phase) of 0.7% and 0.6% respectively, and a short circuit time of 8 minutes and 50 seconds (more than 20 times that of the comparative silver paste).

Furthermore, when an attempt was made to fill via holes of diameter 0.2 mm formed in a double-sided copper clad laminate of thickness 0.4 mm by printing this conductive paste, filling was able to be achieved.

Comparative Example 24

To 25 g of the same binder as that used in the example 28 were added 332.5 g of the spherical silver-coated copper powder used in the example 32, and 142.5 g of the aggregated spherical particles used in the example 32, and the mixture was then mixed and dispersed using an agitation-type stone mill, but the viscosity was high, and uniform mixing was impossible. The volumetric ratio between the spherical silver-coated copper powder and the spherical particles was 73:27, the same as in the example 32.

Example 33

The scale-like MA powder (product name: MA10G) used in the example 23 was used as the substantially monodispersed particles. A silver powder which contained aggregated particles, but which had a primary particle diameter of 1.1 µm, an aspect ratio of 1.2, and a relative packing density of 56% was used as the spherical particles. The particle diameter ratio between the scale-like MA powder and the spherical particles was approximately 13.

700 parts by weight of the above scale-like MA powder, and 300 parts by weight of the spherical particles were mixed for 350 hours in a ball mill with an internal capacity of 3 liters, thus yielding a mixed conductive powder. The volumetric ratio between the scale-like MA powder and the spherical particles was 73:27, the tap density of the mixed conductive powder was 7.30 g/cm$^3$, and the relative packing density was 76%.

To 25 g of the same binder as that used in the example 28 was gradually added 475 g of the mixed conductive powder obtained above, and the mixture was then mixed and dispersed in the same manner as the example 28, thus yielding a conductive paste. The viscosity of the obtained conductive paste at 25° C. was 1090 dPa·s, and the thixotropic index was 5.0.

Using this conductive paste, test substrates were prepared in the same manner as the example 24, and the various characteristics were evaluated in the same manner as the example 24. The results revealed a sheet resistance of 31 mΩ/sq., variations in the circuit resistance following the constant temperature and humidity test and the thermal shock test (gas phase) of 0.6% and 0.8% respectively, and a short circuit time of 9 minutes and 30 seconds (more than 20 times that of the comparative silver paste).

Comparative Example 25

To 25 g of the same binder as that used in the example 28 were added 332.5 g of the scale-like MA powder (product name: MA10G) used in the example 33, and 142.5 g of the aggregated spherical particles used in the example 33, and the mixture was then mixed and dispersed using an agitation-type stone mill, but the viscosity was high, and uniform mixing was impossible. The volumetric ratio between the scale-like particles and the spherical particles was 73:27, the same as in the example 33.

Example 34

The scale-like MA powder (product name: MA10G) used in the example 23 was used as the substantially monodispersed particles. The spherical silver powder used in the example 33 was used as the spherical particles. The particle diameter ratio between the scale-like MA powder and the spherical particles was approximately 12.

65 parts by weight of the above scale-like MA powder, and 35 parts by weight of the spherical particles were mixed for 320 hours in a V-blender, yielding a mixed conductive powder. The volumetric ratio between the scale-like MA powder and the spherical particles was 68:32, the tap density of the mixed conductive powder was 7.25 g/cm$^3$, and the relative packing density was 75%.

To 20 g of the same binder as that used in the example 24 were added 480 g of the mixed conductive powder obtained above and 15 g of ethylcarbitol as a solvent, and the mixture was then mixed and dispersed in the same manner as the example 24, thus yielding a conductive paste. The viscosity of the obtained conductive paste at 25° C. was 980 dPa·s, and the thixotropic index was 5.0.

Using this conductive paste, test substrates were prepared in the same manner as the example 24, and the various characteristics were evaluated in the same manner as the example 24. The results revealed a sheet resistance of 29 mΩ/sq., variations in the circuit resistance following the constant temperature and humidity test and the thermal shock test (gas phase) of 0.5% and 0.6% respectively, and a short circuit time of 10 minutes and 20 seconds (more than 20 times that of the comparative silver paste).

Comparative Example 26

To 20 g of the same binder as that used in the example 24 were added 312 g of the scale-like MA powder (product name: MA10G) used in the example 34, and 168 g of the aggregated spherical particles used in the example 34, and the mixture was then mixed and dispersed using an agitation-type stone mill, but the viscosity was high, and uniform mixing was impossible. The volumetric ratio between the scale-like MA powder and the spherical particles was 68:32, the same as in the example 34.

Example 35

The scale-like silver powder used in the example 1 and the spherical silver powder used in the example 5 were used. The particle diameter ratio between the scale-like particles and the spherical particles was 15.

60 parts by weight of the above scale-like particles, and 40 parts by weight of the spherical particles were mixed for 96 hours in a V-blender, yielding a mixed conductive powder. The volumetric ratio between the scale-like particles and the spherical particles was 60:40, the tap density of the mixed conductive powder was 7.75 g/cm$^3$, and the relative packing density was 74%.

3 parts by weight of dibutyltin (reagent) was added to 100 parts by weight of a silicone resin (product name: Ecosil CN, manufactured by Emerson & Cuming, Inc.) and mixed uniformly, thus forming a binder. 92 parts by weight of the mixed conductive powder obtained above and 8 parts by weight of the thus obtained binder were mixed together in a mortar, and then dispersed for 2 minutes using a three roll mill, thus yielding a conductive paste.

Next, the conductive paste obtained above was applied, with a thickness of 0.15 mm, to a polyethylene terephthalate (PET) film of thickness 19 μm that had undergone surface treatment with a release agent. In addition, another PET film identical to that above was then laminated to the top of the paste layer to prevent air inclusion. This laminated structure was then placed in an aging oven for 4 hours at 80° C., thus yielding a heat conducting sheet with attached PET films, in which PET films had been laminated to both surfaces of a heat conducting sheet of thickness 0.15 mm (hereafter referred to as a heat conducting sheet with attached films). Subsequently, the films were removed from both surfaces, and measurement of the thermal conductivity in the penetration direction through the layer using a laser flash method produced a result of 13 W/m·K.

The heat conducting sheet with attached films obtained above was stamped out into a 2 cm square shape in which a 1 mm square outward projection had been formed at a corner portion, the PET film was peeled off one surface, the heat conducting sheet was pressed onto the top of a 2 cm square aluminum plate of thickness 3 mm, and the remaining PET film was then peeled off the other surface. The projection was grasped during peeling, enabling the peeling to be completed with ease. Subsequently, a stainless steel plate was pressed onto the heat conducting sheet and the structure was clamped, as is, in a vice, and even when removed from the vice, the two plates remained bonded together as a single integrated structure. When a scraper with a tapered edge was then forced into the corner of the heat conducting sheet sandwiched between the aluminum and stainless steel plates, the heat conducting sheet was damaged, but the aluminum plate and the stainless steel plate were able to be separated easily.

Example 36

The scale-like silver powder used in the example 3 and the spherical silver powder (small particles) used in the example 11 were used. The particle diameter ratio between the scale-like particles and the spherical particles was 15.

80 parts by weight of the above scale-like particles, and 20 parts by weight of the spherical particles were mixed for 80 hours in a ball mill, yielding a mixed conductive powder. The volumetric ratio between the scale-like particles and the spherical particles was 80:20, the tap density of the mixed conductive powder was 7.65 g/cm$^3$, and the relative packing density was 73%.

91.5 parts by weight of the thus obtained mixed conductive powder and 8.5 parts by weight of the binder obtained in the example 35 were then mixed and dispersed in the same manner as the example 35, thus yielding a conductive paste.

Using the thus obtained conductive paste, a heat conducting sheet with attached films, comprising PET films laminated to both surfaces of a heat conducting sheet of thickness 0.15 mm, was prepared in the same manner as the example 35. Subsequently, the PET films were removed from both surfaces, and measurement of the thermal conductivity in the penetration direction through the layer using a laser flash method produced a result of 8.7 W/m·K. Furthermore, the heat conducting sheet generated by removing the PET films from the heat conducting sheet with attached films was sandwiched between an aluminum plate and a stainless steel plate in the same manner as the example 35, and was able to generate a single integrated structure.

Example 37

The scale-like silver powder used in the example 5 and the spherical silver powder (small particles) used in the example 11 were used. The particle diameter ratio between the scale-like particles and the spherical particles was approximately 15.

75 parts by weight of the above scale-like particles, and 25 parts by weight of the spherical particles were mixed for 120 hours in a V-blender, yielding a mixed conductive powder. The volumetric ratio between the scale-like particles and the spherical particles was 75:25, the tap density of the mixed conductive powder was 7.81 g/cm$^3$, and the relative packing density was 74%.

92.3 parts by weight of the thus obtained mixed conductive powder and 7.7 parts by weight of the binder obtained in the example 35 were then mixed and dispersed in the same manner as the example 35, thus yielding a conductive paste.

Using the thus obtained conductive paste, a heat conducting sheet with attached films, comprising PET films laminated to both surfaces of a heat conducting sheet of thickness 0.15 mm, was prepared in the same manner as the example 35. Subsequently, the PET films were removed from both surfaces, and measurement of the thermal conductivity using a laser flash method produced a result of 14 W/m·K. Furthermore, the heat conducting sheet generated by removing the PET films from the heat conducting sheet with attached films was sandwiched between an aluminum plate and a stainless steel plate in the same manner as the example 35, and was able to generate a single integrated structure.

Comparative Example 27

90 parts by weight of the mixed conductive powder obtained in the comparative example 3 and 10 parts by weight of the binder obtained in the example 35 were mixed together in a mortar, but were unable to be converted to paste form, and remained as a dry mixture.

Comparative Example 28

90 parts by weight of the mixed conductive powder obtained in the comparative example 6 and 10 parts by weight of the binder obtained in the example 35 were mixed together in a mortar, but were unable to be converted to paste form, and remained as a dry mixture.

The invention claimed is:

1. A mixed conductive powder, consisting of a first set of particles, which is substantially monodispersed conductive substantially spherical particles (A2), and a second set of particles, which is conductive substantially spherical particles (B2) with a smaller particle diameter than that of the particles (A2), and with a relative packing density of at least 68%,
wherein an average particle diameter of the particles (A2) is from 2 to 50 times an average particle diameter of the particles (B2).

2. The mixed conductive powder according to claim 1, wherein an average particle diameter of the particles (A2) is from 3 to 25 μm.

3. The mixed conductive powder according to claim 1, wherein an average particle diameter of the particles (A2) is from 5 to 25 times an average particle diameter of the particles (B2).

4. The mixed conductive powder according to claim 1, wherein a blend ratio, reported as volumetric ratio, in the mixed conductive powder between the particles (A2) and the particles (B2), (A2):(B2), is within a range from 95:5 to 55:45.

5. The mixed conductive powder according to claim 4, wherein said blend ratio, as a volumetric ratio, is within a range of from 85:15 to 55:45.

6. The mixed conductive powder according to claim 1, wherein aspect ratios of both the particles (A2) and the particles (B2) are at least 1.0 but less than 1.5.

7. The mixed conductive powder according to claim 1, wherein an average particle diameter of the particles (B2) is from 0.3 to 3.0 μm.

8. A sheet comprising a mixed conductive powder according to claim 1 and a resin binder, wherein a blend ratio of the mixed conductive powder is from 85 to 96% by weight.

9. A sheet with attached film, comprising the sheet according to claim 8, and a releasable film laminated to at least one surface of the sheet.

10. The sheet with attached film according to claim 9, wherein releasable films are laminated to both surfaces of the sheet.

11. The mixed conductive powder according to claim 7, wherein an average particle diameter of the particles (A2) is from 5 to 18 μm.

12. The mixed conductive powder according to claim 2, wherein an average particle diameter of the particles (B2) is from 0.5 to 2.5 μm.

13. A conductive paste comprising a mixed conductive powder according to claim 1, and a resin binder.

14. The conductive paste according to claim 13, wherein a blend ratio of the mixed conductive powder, relative to a solid fraction of the conductive paste, is from 85 to 96% by weight, and a blend ratio of the resin binder is from 4 to 15% by weight.

15. The conductive paste according to claim 13, wherein a solvent content within the conductive paste is no more than 2% by weight.

* * * * *